(12) United States Patent
Nakagawa et al.

(10) Patent No.: US 7,545,684 B2
(45) Date of Patent: Jun. 9, 2009

(54) NONVOLATILE SEMICONDUCTOR STORAGE DEVICE AND OPERATION METHOD THEREOF

(75) Inventors: Michio Nakagawa, Yokohama (JP); Koji Sakui, Setagaya-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 48 days.

(21) Appl. No.: 11/815,387

(22) PCT Filed: Feb. 3, 2006

(86) PCT No.: PCT/JP2006/301834

§ 371 (c)(1), (2), (4) Date: Aug. 2, 2007

(87) PCT Pub. No.: WO2006/082914

PCT Pub. Date: Aug. 10, 2006

(65) Prior Publication Data

US 2008/0192549 A1 Aug. 14, 2008

(30) Foreign Application Priority Data

Feb. 3, 2005 (JP) ............................. 2005-027719

(51) Int. Cl.
*G11C 5/14* (2006.01)
(52) U.S. Cl. .............................. 365/189.09; 365/185.19
(58) Field of Classification Search ............ 365/189.09, 365/185.19, 185.17; 327/170, 536; 363/60
See application file for complete search history.

(56) References Cited

U.S. PATENT DOCUMENTS 5,945,870 A * 8/1999 Chu et al. ................... 327/536

2002/0125935 A1 * 9/2002 Sawada et al. .............. 327/536
2005/0174815 A1 * 8/2005 Chen et al. ................... 363/60

FOREIGN PATENT DOCUMENTS

| JP | 7 169284 | 7/1995 |
|---|---|---|
| JP | 2000 76878 | 3/2000 |
| JP | 2001 57091 | 2/2001 |
| JP | 2004 274861 | 9/2004 |

OTHER PUBLICATIONS

Hemink, et al., "Fast and Accurate Programming Mehtod for Multi-level NAND EEPROMs". Symposium on VLSI Technology Digest of Technical Papers, p. 129-130, 1995.

* cited by examiner

*Primary Examiner*—Vu A Le
(74) *Attorney, Agent, or Firm*—Oblon, Spivak, McClelland, Maier & Neustadt, P.C.

(57) ABSTRACT

A nonvolatile semiconductor memory device includes a plurality of electronically reprogrammable memory cells, a circuit for applying a plurality of pulse signals having corresponding high level potentials increasing step by step to said memory cell, and verify circuit for detecting a threshold value of said memory cell after applying said plurality of pulse signals. Further, the circuit for applying said plurality of pulse signals includes a first circuit for generating a first clock having a first amplitude voltage and a second clock having a second amplitude voltage which is higher than said first amplitude voltage, a second circuit for generating said plurality of said pulse signal having corresponding predetermined voltages based on said first clock or said second clock input from said first circuit respectively, and a third circuit for stopping an input of said first clock and said second clock to said second circuit when said plurality of pulse signals generated by said second circuit reach said corresponding predetermined voltages respectively.

11 Claims, 33 Drawing Sheets

NONVOLATILE SEMICONDUCTOR STORAGE DEVICE AND OPERATION METHOD THEREOF

BACKGROUND OF THE INVENTION

1. Field of the Invention

This invention is related to an electronically reprogrammable nonvolatile semiconductor memory device. Within nonvolatile semiconductor memory devices, it is related to a nonvolatile semiconductor memory device such as an EEPROM etc. of the NAND cell type, the NOR cell type, the DINOR cell type, or the AND cell type.

2. Description of the Related Art

Conventionally, an electronically reprogrammable EEPROM is known as one type of semiconductor memory device. Within these, a NAND cell type EEPROM (NAND type flash memory), which is composed of a NAND cell block connecting a plurality of memory cells in series, is receiving attention for being highly integrated compared to other memories. The conventionally used data program and erasure operations of the in a NAND cell type EEPROM are as follows.

The data program operation is mainly performed in sequence from the memory cell which is located the furthest away from the bit line. First, when the data program operation begins, 0V ("0" data program) or a power supply voltage Vcc ("1" data program) is applied to the bit line and Vcc is applied to the selected gate line of the side of the selected bit line.

In this case, when the bit line is at 0V, in the connected selected NAND cell, the channel section within the NAND cell through a selected gate transistor is at 0V. When the bit line is at Vcc, in the connected selected NAND cell, after the channel section within the NAND cell is charged through a selected gate transistor up to (Vcc−Vtsg) (where Vtsg is the select gate transistor's threshold voltage) the channel section takes on a floating state.

Subsequently, the control gate line of the selected memory cell within the selected NAND cell is applied with 0V to Vpp (Vpp is about 20V: a program high level voltage) and the control gates of the non-selected memory cells within the selected NAND cell are applied with 0V to Vmg (Vmg is about 10V: a medium level voltage).

Here, when the bit line is at 0V, because the channel section within the NAND cell in the connected selected cell is at 0V, a large voltage potential difference occurs between the selected memory cell gate within the selected NAND cell (=Vpp voltage) and the channel section (=0V) and electrons are injected from the channel section into the floating gate. By this, the threshold voltage of that selected memory cell is shifted in a positive direction. This state is "0."

Alternatively, when the bit line is at Vcc, because the channel section within the NAND cell in the connected selected NAND cell is in a floating state, following the voltage increase (0V→Vpp, Vmg) in the control gate under the influence of capacity coupling between the control gate line within the selected NAND cell and the channel section, the voltage of the channel section, while maintaining a floating state, increases from (Vcc−Vtsg) volts to Vmch (=about 8V). At this time, because the voltage potential difference between the selected memory cell gate (=Vpp volts) and the channel section (=Vmch) is relatively small at about 12V, electron injection does not occur and therefore the voltage threshold of the selected memory cell does not change and the negative threshold is maintained. This state is "1."

Data erasure in the NAND cell type EEPROM is done upon all the memory cells within the selected NAND cell block simultaneously. More specifically, all the control gates within the selected NAND cell block are applied with 0V, the bit lines, the source line, the control gates within the non-selected NAND cell block and all the selected gates are is made to float and the p type well (or p type plate) is applied with a high level voltage of about 20V. By this, the electrons in the floating gates are released into the p type well (or the p type plate) in all the memory cells within the selected NAND cell block and the voltage threshold is shifted in a positive direction. In this way, in the NAND cell type EEPROM, data erasure is done at once in block units.

At the time of a data read operation, the control gate of the selected memory cell is applied with 0V and the control gates and select gates of all the other memory cells are applied with a voltage (for example 5V), which is regulated from the stress caused at the time of the read-out operation, and a data read is carried out by detecting whether an electric current within the selected memory cell occurs.

From the constraint of read operations, as stated above, when 5V, for example, is the voltage regulated from the stress at the time of a read operation, the voltage threshold after "0" data program must be controlled between 0V and about 4V. Because of this, program verify operations take place, and only the memory cells which are deficient in "0" program are detected and reprogram data is set so that a reprogram can be performed only on the memory cells deficient in "0" program (each-bit-verify). A memory cell deficient in "0" program is detected by read-out operation (verify read-out) with the selected control gate being applied with, for example, 0.5V (a voltage for verifying). In other words, if the memory cell voltage threshold is not more than 0.5V, which is a margin enough toward 0V, there occurs an electric current in the selected memory and a deficiency in "0" program is detected.

By programming data with repeated program operations and program verify operations, the program time is optimized and "0" program voltage threshold is controlled between 0V and about 4V in the individual memory cells.

In this kind of a NAND cell type EEPROM, because the program voltage at the time of program is maintained at Vpp, in the early program stage, in which the charge storage layer holds a relatively small amount of electrons, the change in the memory cell voltage threshold is fast, and in the later program stage, in which the charge storage layer holds a relatively large amount of electrons after electrons are injected into the charge storage layer, the change in the memory cell voltage threshold is slow. Also, in the early program stage, the electrical field, which is applied to the insulation layer in which tunnel current flows, is strong but in later program stages the electrical field becomes weak.

As a result of this, when program voltage Vpp is increased in order to increase the speed of programming, the largest voltage threshold after programming becomes so high and the distribution of the values of thresholds after programming becomes so wide that the electrical field which is applied to the insulation layer, in which tunnel current flows, also becomes stronger and reliability also becomes worse. Conversely, when Vpp is lowered in order to narrow the distribution of the values of threshold after programming, the speed of programming becomes slower. In other words, there is a problem whereby the program voltage margin is narrow. Also, there is the problem that as a data program operation or a erasure operation progresses the efficiency of the data program operation or the erasure operation worsen.

Considering the above stated problems, the Japan patent application KOKAI publication No. H07-169284 and the non-patent document by G. J. Hemink et al. in the Symposium on VLSI Technology Digest of Technical Papers, 1995, pp. 129-130 propose methods which gradually increase the program voltage Vpp while repeating cycles of the program operations and each bit verify operations. In the method cited in the Japan patent application KOKAI publication No. H07-169284, only the Vpp is constantly increased each cycle by ΔVpp, and the program time Δt is maintained constant. Also, ΔVpp and Δt are set so that the distribution of the values of thresholds after "0" programming becomes ΔVpp.

It is the purpose of this invention to provide a nonvolatile semiconductor memory device and an operation method thereof which can prevent a reduction of efficiencies of a data program operation and an erasure operation and is able to shorten the time necessary for a data program operation and a data erasure operation.

BRIEF SUMMARY OF THE INVENTION

A nonvolatile semiconductor memory device related to one embodiment of this invention comprises:

a plurality of electronically reprogrammable memory cells, means for applying a plurality of pulse signals gradually changing to high voltages to said memory cell, verification means to detect thresholds of said memory cell after applying said plurality of pulse signals, wherein said means for applying said plurality of pulse signals comprises:

a first circuit which generates a first clock having a first amplitude voltage and a second clock having a second amplitude voltage which is higher than said first clock:

a second circuit which generates said pulse signal having a prescribed voltage based on said first clock or said second clock which are input from said first circuit;

a third circuit which stops input to said second circuit of said first clock and said second clock when said pulse generated by said second circuit reaches said prescribed voltage.

DETAILED DESCRIPTION OF THE INVENTION

The inventors of the present invention found the following problems in the conventional data program methods cited in the aforementioned Japan patent application KOKAI publication and in the aforementioned technical paper.

In other words, while in a nonvolatile semiconductor memory device the shape of a program pulse at a time of data program, is preferred to be "an ideal trapezoidal shape waveform," as a matter of convenience of the program pulse generation circuit, it is difficult to install a program pulse generation circuit which generates "an ideal trapezoidal shape waveform" on the same chip as that of a memory array. Consequently, in the conventional data program methods cited in the aforementioned Japan patent application KOKAI publication and in the aforementioned technical paper, a pulse waveform has been made into "a step shaped wave form." Consequently, compared with the ideal trapezoidal shape waveform the data program efficiency decreases.

Also, while by making the intervals of program pulses whose waveforms are of a step shape smaller it is possible to get a program pulse shape near to the "ideal trapezoidal shape waveform," the number of verify times increase and as a result, a time of a data program operation or a data erasure operation also increases.

Consequently, the inventors of this invention have found that by increasing little by little by the increments of the step-up width $\Delta Vpp$ the potential of the program pulses in one series of the data program operation it is possible to prevent a precipitous electrical field being applied to a memory cell (a flow of precipitous tunnel current) in the succeeding series of program pulses after a verify operation and it is possible to control the degradation of a tunnel oxide film or break in insulation etc, and not only is it possible to realize a reduction in data program time but also it is possible to improve the reliability of a nonvolatile semiconductor memory device.

In the present embodiment, a NAND cell type nonvolatile semiconductor memory device is taken as an example of a nonvolatile semiconductor memory device of this invention and is explained.

Figure 1A:
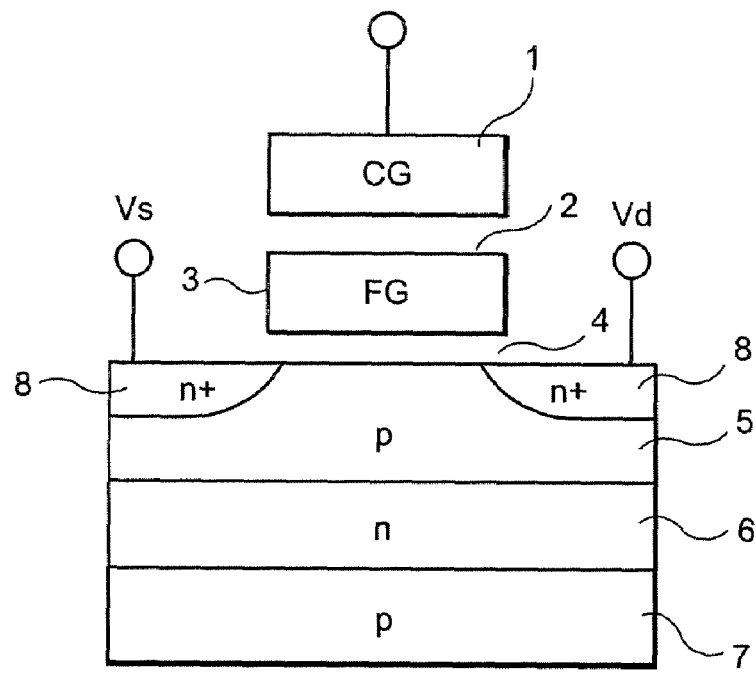
FIG. 1(a) is a diagram showing an overview of a construction of a memory cell of one embodiment of a nonvolatile semiconductor memory device of this invention.
Figure 1B:
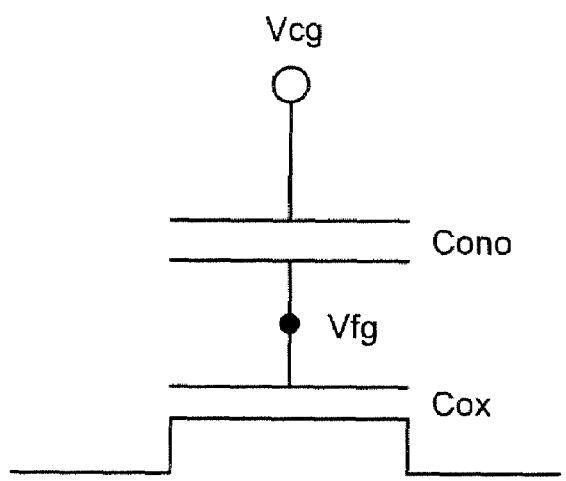
FIG. 1(b) is an equivalent circuit diagram of its construction.

Firstly, FIG. 1 is referred to. FIG. 1(a) shows an outline construction of a memory cell in a nonvolatile semiconductor memory device of this invention related to this embodiment. FIG. 1(b) is an equivalent circuit diagram of its construction. A floating gate (FG) and a control gate (CG) are formed in layers above a p type silicon plate 7, an n type well 6 and a p type well 5. The p type well 5 and the floating gate 3 are insulated by a tunnel oxide layer 4, the floating gate 3 and the control gate 1 are insulated by an insulation layer 2. An n type diffusion layer 8 forms a memory cell source/drain. Further, any material can be used as long as it functions as a charge storage layer. For example, as a charge storage layer which can be used in one embodiment of this invention aside from a metal layer, a material can be used which has a construction of a "SONOS", formed by a storage construction of an oxide silicon layer, a nitride silicon layer and an oxide silicon layer.

As shown in FIG. 1(b) the capacity between the floating gate 3 and the control gate 1 is defined as Cono and the capacity between the floating gate 3 and the p type well 5 is defined as Cox. Further, because the capacity between the floating gate 3 and the n type diffusion layer 8 is so small compared to Cono and Cox that it can be ignored, it is not considered here.

The memory cell holds a charge which is stored in the floating gate 3 so that data is programmed. Then, depending on the amount of charges stored in the floating gate 3 the memory cell threshold value (Vth) varies. The amount of charges stored within the floating gate 3 are controlled by an FN tunnel electric current (Fowler—Nordheim electric current) which passes through tunnel oxide layer 4

When the potential of the control gate 1 is sufficiently increased to the potential of the p type well 5 and n type diffusion layer 8, electrons are injected into the floating gate 3 passing through the tunnel oxide layer 4 and the memory cell threshold value increases. Alternatively, when the potential of the p type well 5 and the n type diffusion layer 8 is increased to the potential of the control gate 1 electrons are released from the floating gate 3 passing through the tunnel oxide layer 4 and the memory cell threshold value decreases.

Figure 32:
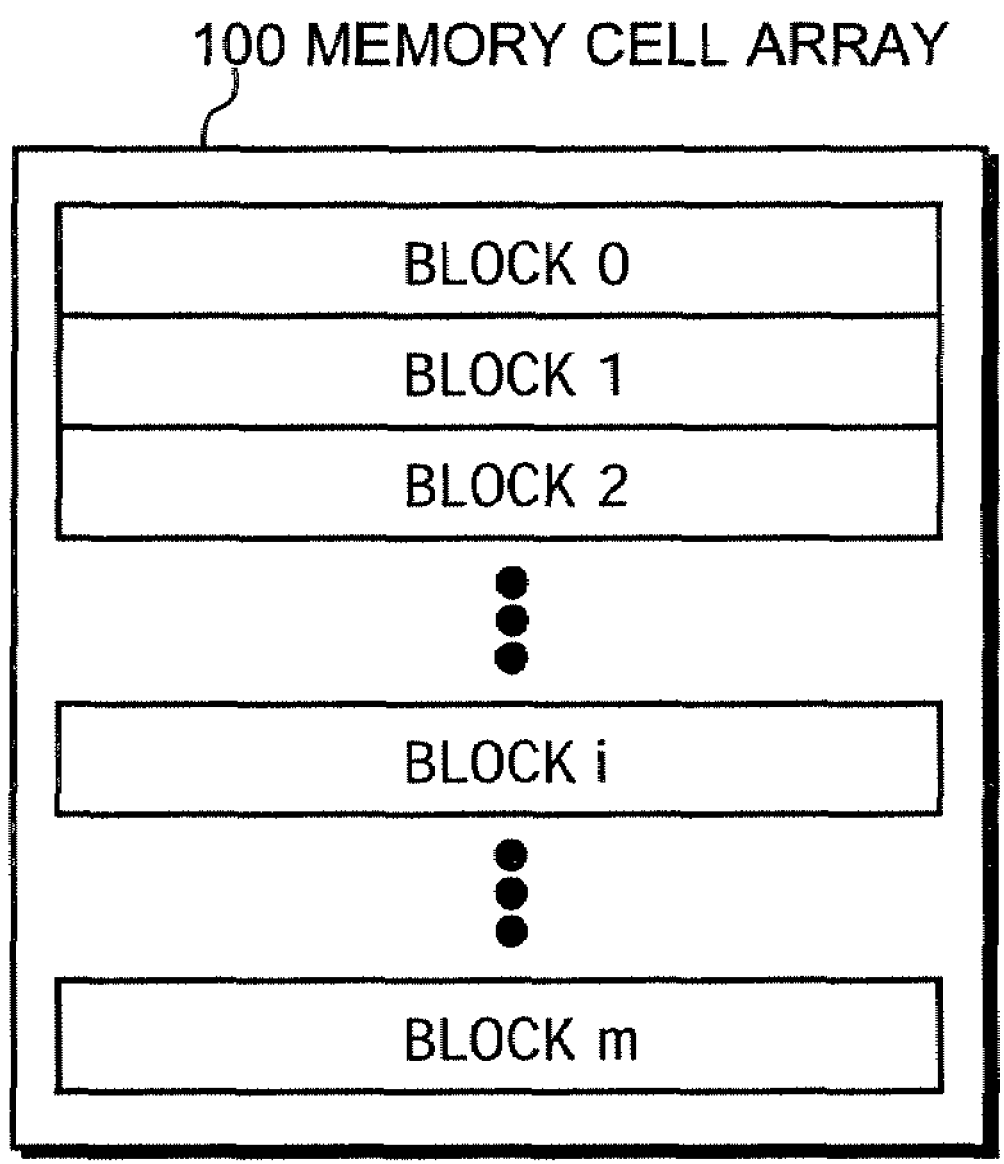
FIG. 32 is a diagram showing a construction of a memory cell array of a nonvolatile semiconductor memory device related to one embodiment of this invention.

The nonvolatile semiconductor memory device related to one embodiment of this invention has a memory cell array 100. The memory cell array 100 is divided into a plurality of blocks (BLOCKs). FIG. 32 shows an appearance where the memory cell is divided into a total of m blocks (BLOCK0, BLOCK1, BLOCK2, . . . , BLOCKi . . . , BLOCKm). Further, a "block" is the smallest unit of a data erasure operation.

Figure 33:
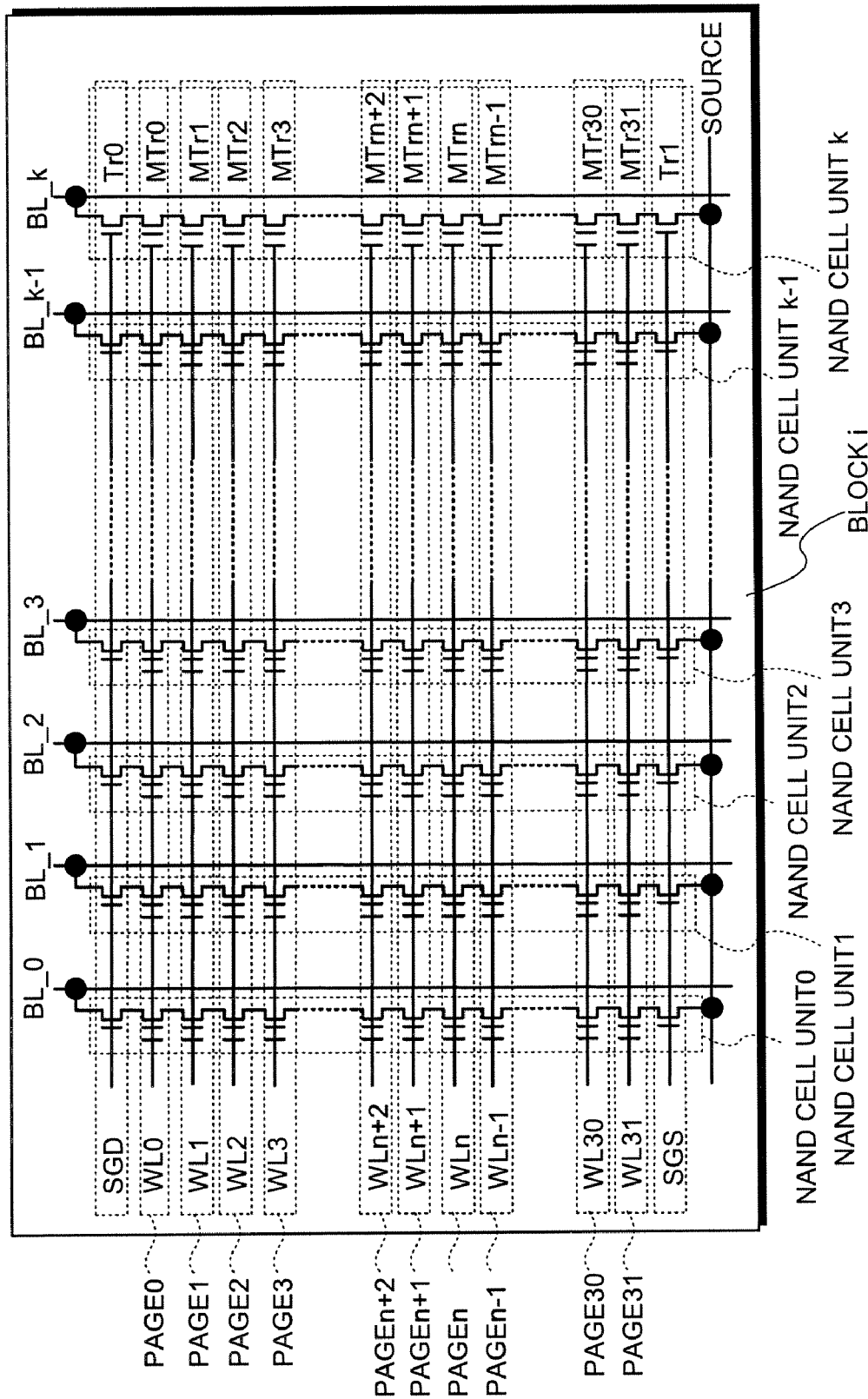
FIG. 33 is a diagram showing a circuit construction of a memory cell array block BLOCKi of a nonvolatile semiconductor memory device related to one embodiment of this invention.

Also, each block of BLOCK0~BLOCKm is constructed by k+1 units of a NAND cell unit 0~k, such as block BLOCKi representatively shown in FIG. 33. Each NAND cell unit is constructed by 32 memory cells MTr0~MTr31, which are connected in series. One end is connected to a bit line BL (one of BL_0, BL_1, BL_2, BL_3, . . . , BL_k−1, and BL_k) through a select gate transistor, which is connected to a select gate line SGD, and the other end is connected to a common source line SOURCE through a select gate transistor Tr1, which is connected to a select gate line SGS. The control gate of each memory cell MTr is connected to a word line WL (one of WL0~WL31). Each memory cell MTr of k units is connected to one word line WL, 1 bit data is recorded and these memory cells MTr of k units compose a "page."

Further, whilst in FIGS. 32 and 33 the number of blocks which compose a memory cell array is given as m units, and in FIG. 33 one block includes k+1 blocks, 32 memory cells MTrs, which become a NAND cell unit, it is not limited to these constructions, i.e., the number of blocks, memory cells MTrs, or NAND cell units can be changed such as 64 in accordance with the capacity of a nonvolatile semiconductor memory device.

Also, whilst each memory cell MTr is made to record one bit data, each memory cell MTr can be made to record a plurality of bit data (multi-valued bit data) in accordance with the amount of electrons injected. Also, though an example of a NAND type flash memory device in which one NAND cell unit is connected to one bit line BL is explained, the NAND type flash memory device of the present invention can be appropriately made into what is called a shared bit line type NAND flash memory device where a plurality of NAND cell units share one bit line BL.

Figure 10:
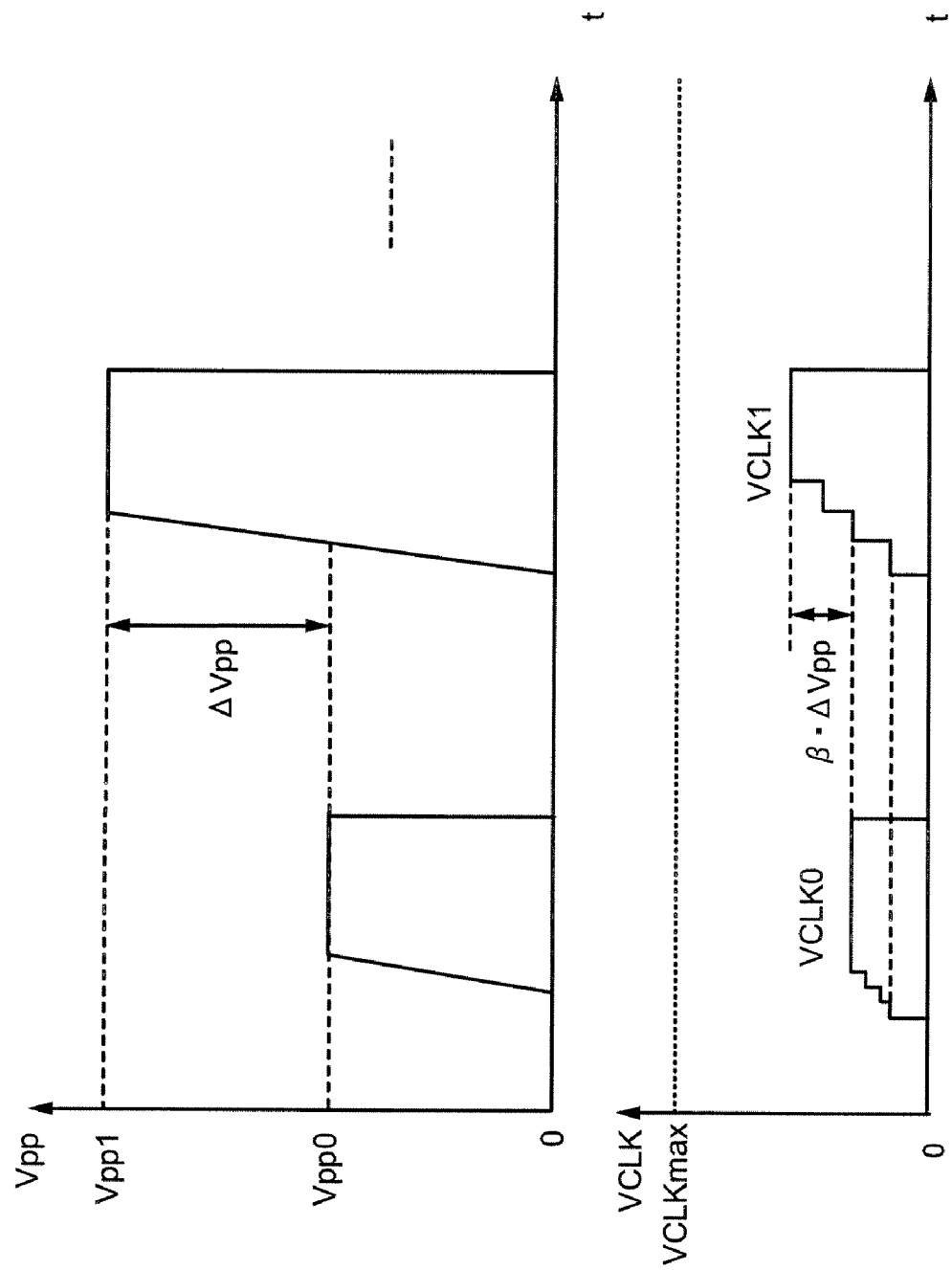
FIG. 10 is a graph which shows a relationship between a required target output voltage (Vpp0, Vpp1 etc) and a clock voltage amplitude having a predetermined amplitude corresponding to the required target output voltage related to one embodiment of a nonvolatile semiconductor memory device of this invention.

Also, each block of BLOCK0~BLOCKm is constructed by 2×(k+1) units of NAND cell units e0~ok, as in a block BLOCKi representatively shown in FIG. 10. Each NAND cell unit is constructed by 32 memory cells MC0~MC31 which are connected in series, one end is connected to a bit line BL (one of BLe_0, BLo_1, . . . , BLe_k, and BLo_k) through a select gate transistor SG1 which is connected to a select gate line SGD_i, and the other end is connected to a common source line CELSRC through a select gate transistor SG2 which is connected to a select gate line SGS_i. The control gate of each memory cell MC is connected to a word line WL (one of WL0_i~WL31_i). An even number bit line BL_e and an odd number bit line BL_o counting from 0 both perform a data program operation and a read-out operation independently. Simultaneous data program and read out operations are performed on k+1 memory cells which are connected to an even numbered bit line BL_e amongst 2×(k+1) memory cells which are connected to one word line WL. Each memory cell records 2 bits of data and these memory cells of k+1 units compose a "page."

Similarly, another page is composed of k+1 memory cells which are connected to an odd numbered bit line BL_o connected to one word line WL and to the memory cells of this page, and simultaneous data program and read-out operations are performed.

Further, while the description is done so far that the number of blocks which compose a memory cell array is given as m units, and that one block includes 2×k+1 NAND cell units of 32 memory cells, it is not limited to this constitution and the number of blocks, the number of memory cells, or the number of NAND cell units can be changed according to the desired capacity.

Figure 2:
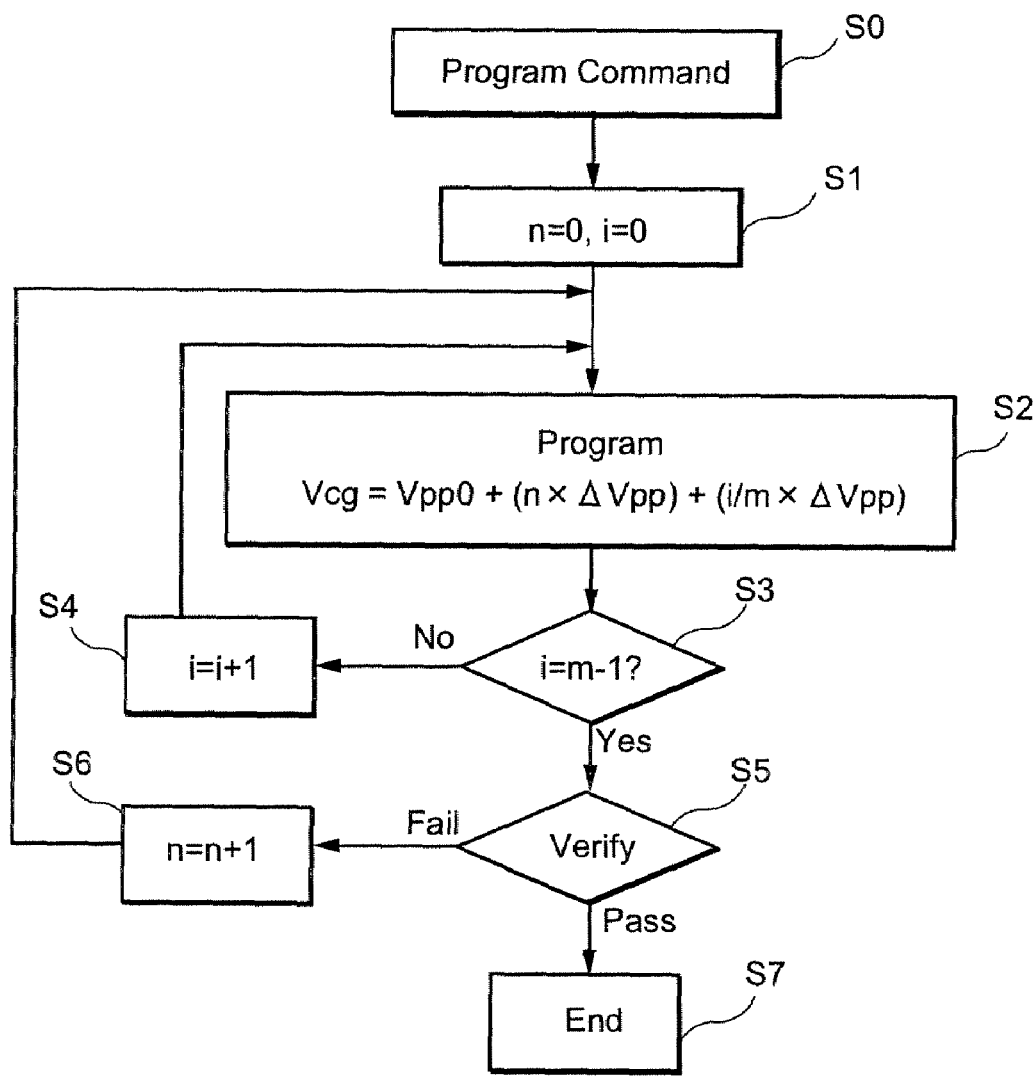
FIG. 2 is a flowchart of a data program time in one embodiment of a nonvolatile semiconductor memory device of this invention.
Figure 3:
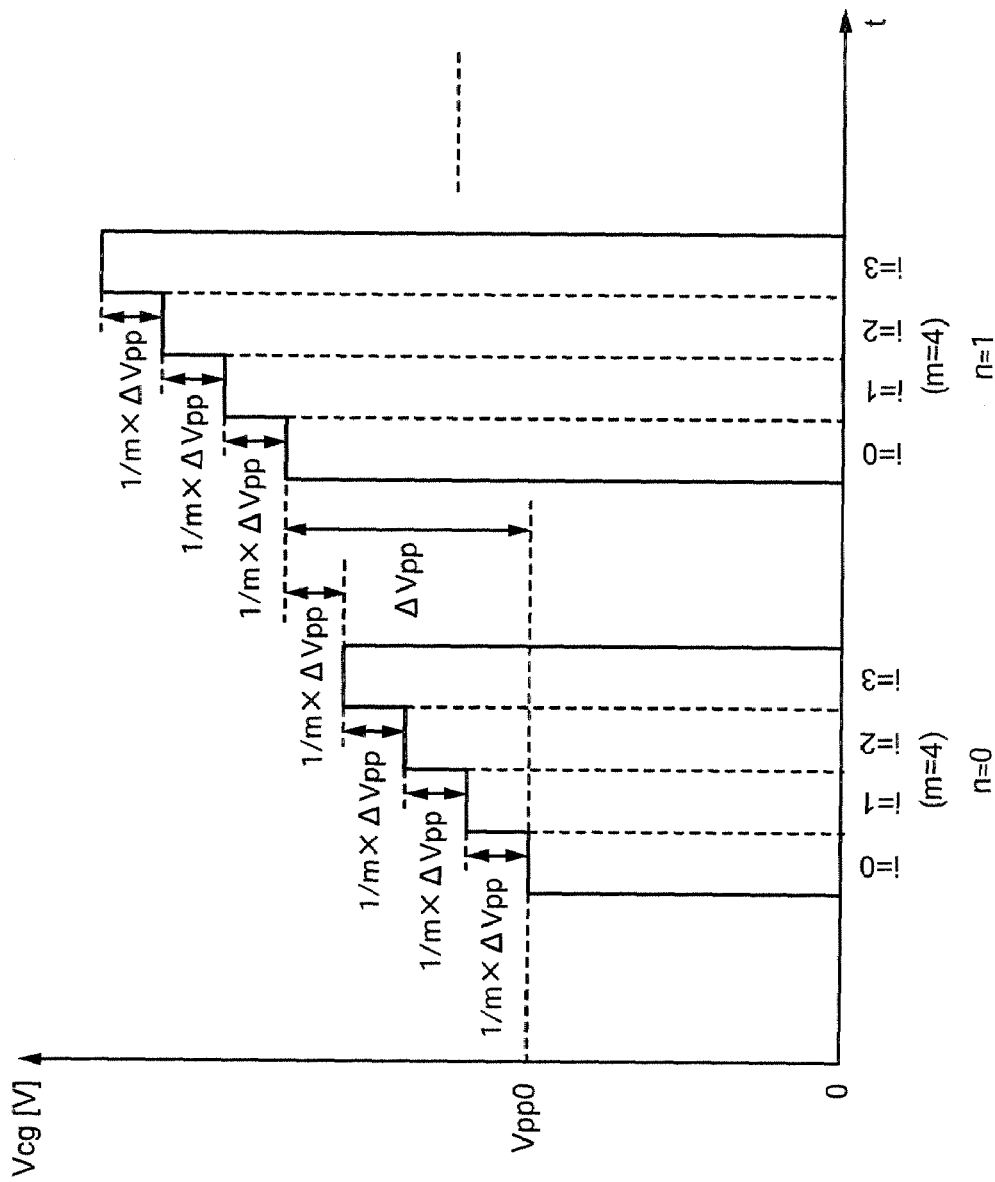
FIG. 3 is a timing chart of programming pulses applied to a control gate 1 of one embodiment of a nonvolatile semiconductor memory device of this invention.

Next, with reference to FIGS. 2 and 3, a data program operation is explained as an operation method of a nonvolatile semiconductor memory device of this invention. In FIG. 2, a flowchart at the time of a data program operation of a nonvolatile semiconductor memory device in this embodiment of this invention is shown. Also, in FIG. 3, a timing chart of a program pulse which is applied to the control gate 1 of a nonvolatile semiconductor memory device in this embodiment of this invention is shown. Further, in FIG. 3, the first time series of program pulses (where n=0) and the second time series of program pulses (where n=1) is shown. Further, in the present embodiment, 4 program pulses (i=0~3) are included in one series of program pulses. The number of program pulses in one series of program pulses is defined as m. Also, in the interval between the first time series of program pulses (where n=0) and the second time series of program pulse series (where n=1), an each-bit-verify is performed.

As shown in FIG. 2, in a nonvolatile semiconductor memory device of this invention a data program operation begins by a data program command (stepS0) and the parameters n and i are initialized so that n=0 and i=0 (step S1). Next, in the first time series of program pulses (where n=0) the program pulse initial value Vpp is applied with i=0 (step S2). In the present embodiment, the program pulse Vcg is defined by the formula (1) below.

$$Vcg = Vpp0 + (n \times \Delta Vpp) + (I/m \times \Delta Vpp) \quad (1)$$

Here, Vpp0 is an initial value of the program pulses, ΔVpp is a step-up width between the series of program pulses, (I/m×ΔVpp) is a program pulse step-up width in one series of the program pulses.

And, until i=m holds, steps S2 to S4 are repeated. In other words, after the initial value Vpp0 of the program pulse is applied with i=0, potential is increased from Vpp0 step by step by (I/m×ΔVpp) and the program pulses are continuously applied (where i=1,2,3) (step S2).

Then, after a program pulse with i=m−1 (in this embodiment i=4−1=3) is applied (step S2) it is judged to be i=m−1 (step S3), the application of the first time series of program pulses (n=0) finishes, and an each-bit-verify is performed to detect whether the memory cell threshold value is higher than a prescribed value (step S5).

In the case where it is judged that a data program is insufficient by the each-bit-verify (Fail), 1 is added to the parameter n (step S6) and the second time series of program pulses (where n=1) is applied (S2~S4). The program pulse in this second time series of program pulses (where n=1) is defined by the above stated formula (1) and after the initial program pulse value (Vpp0+ΔVpp) is applied with i=0, the program pulses are continuously applied (where i=1,2,3) with an increase of (I/m×ΔVpp) (step S2). Then, after a program pulse with i=m−1 (in this embodiment i=4−1=3) is applied (step S2) it is judged to be i=m−1 (step S3), the application of the second time series of program pulses (n=1) finishes and an each-bit-verify is performed again (step S5).

Until a data program is judged to be sufficient by an each-bit-verify operation (step S5) the above stated steps S2~S6 are repeated. When a data program is judged to be sufficient by an each-bit-verify operation (Pass), the data program operation ends (step S7).

Further, in the present embodiment, although the value of m, which is a number of program pulses in one series of program pulses is given as 4, it is not limited to this number and the prescribed m value can be changed at an appropriate time of design.

Figure 4:
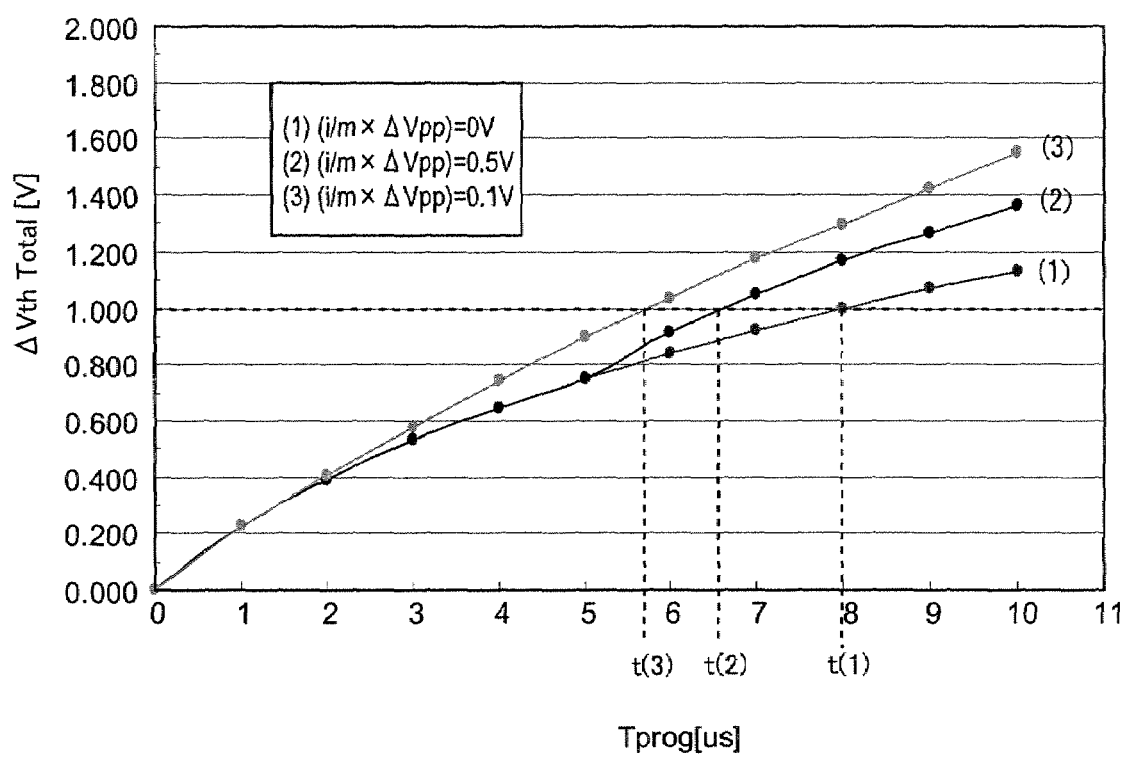
FIG. 4 is a computer simulation result obtained by using an equivalent circuit of a memory cell of one embodiment of a nonvolatile semiconductor memory device of this invention shown in FIG. 1(b).

Here, FIG. 4 is referred to. In FIG. 4 a computer simulation result, which uses a memory cell equivalent circuit shown in FIG. 1(b) of a nonvolatile semiconductor memory device of this invention, is shown. In FIG. 4 the vertical axis shows a sum of the change (ΔVth) of memory cell threshold values and the horizontal axis shows a time necessary for a data program (Tprog). In FIG. 4 a simulation result of the following 3 parameter conditions ((1), (2), (3)) is shown. Further, in whichever of the three parameter conditions the initial program pulse value Vpp0 is 20V, ΔVpp=1V and the program time (Tprog) is up to 10 μs. Also, in FIG. 4 the case where n=0 is shown.

(1) a condition under which the step-up width (I/m×ΔVpp) is 0V: (Vcg=Vpp0)

(2) a condition under which the step-up width (I/m×ΔVpp) is 0.5V; (m=2)

(3) a condition under which the step-up width (I/m×ΔVpp) =0.1V; (m=10)

Further, the condition (1) corresponds to a conventional data program operation because a data program pulse step-up width (I/m×ΔVpp) is 0V.

The parameters and formulas used in the computer simulation shown in FIG. 4 are as follows.

ΔVth=Itunnel×Tprog/Cono

Itunnel=s×α×E²×exp(−β/E)

S (memory cell Cox area)=0.005041[μm²]

E (electric field strength)=Vfg/Tox

α=6.94×10⁻⁷ [A/V²]

β=2.54×10⁸ [V/cm]

Tox=8.2[nm]

Cono=Cox=0.0212[fF]

As is clear from a result shown in FIG. 4 when times (t(1), t(2), t(3)) of a data program necessary for the sum of change of threshold value to reach 1.000V, for example, compared to the conventional program operation condition (1) a 15% to 20% reduction in time of a data program can be realized by the program operation conditions (2) and (3) of this invention. Also, from a result shown in FIG. 4 the narrower the program pulse step-up width (I/m×ΔVpp) is made, the more the reduction in time of a data program can be realized.

As stated above, according to a nonvolatile semiconductor memory device of the present invention and an operation method thereof, a reduction in time of a data program can be realized. Also, according to a nonvolatile semiconductor memory device of the present invention and an operation method thereof, in a series of program pulses, by increasing the potential of a program pulse little by little by increments of a step-up width (i/m×ΔVpp) an application of a precipitous electric field in the memory cell can be prevented in the succeeding series of program pulses after a each-bit-verify operation and it is possible to control the degradation of a tunnel oxide film or break in insulation etc. and it is possible to improve the reliability of a nonvolatile semiconductor memory device.

EMBODIMENT 1

Generally, when 2 or more is requested as the target output voltage levels of a pulse generation circuit (a high voltage generation circuit) the lower the target output voltage is the shorter the time needed to reach that voltage becomes. On the other hand, the following problem occurs. In other words, after the target output voltage has been reached the clock of a high voltage generation circuit is stopped and the target output voltage is maintained constant, however, the lower a target output voltage the greater a voltage overshoot becomes.

Figure 5:
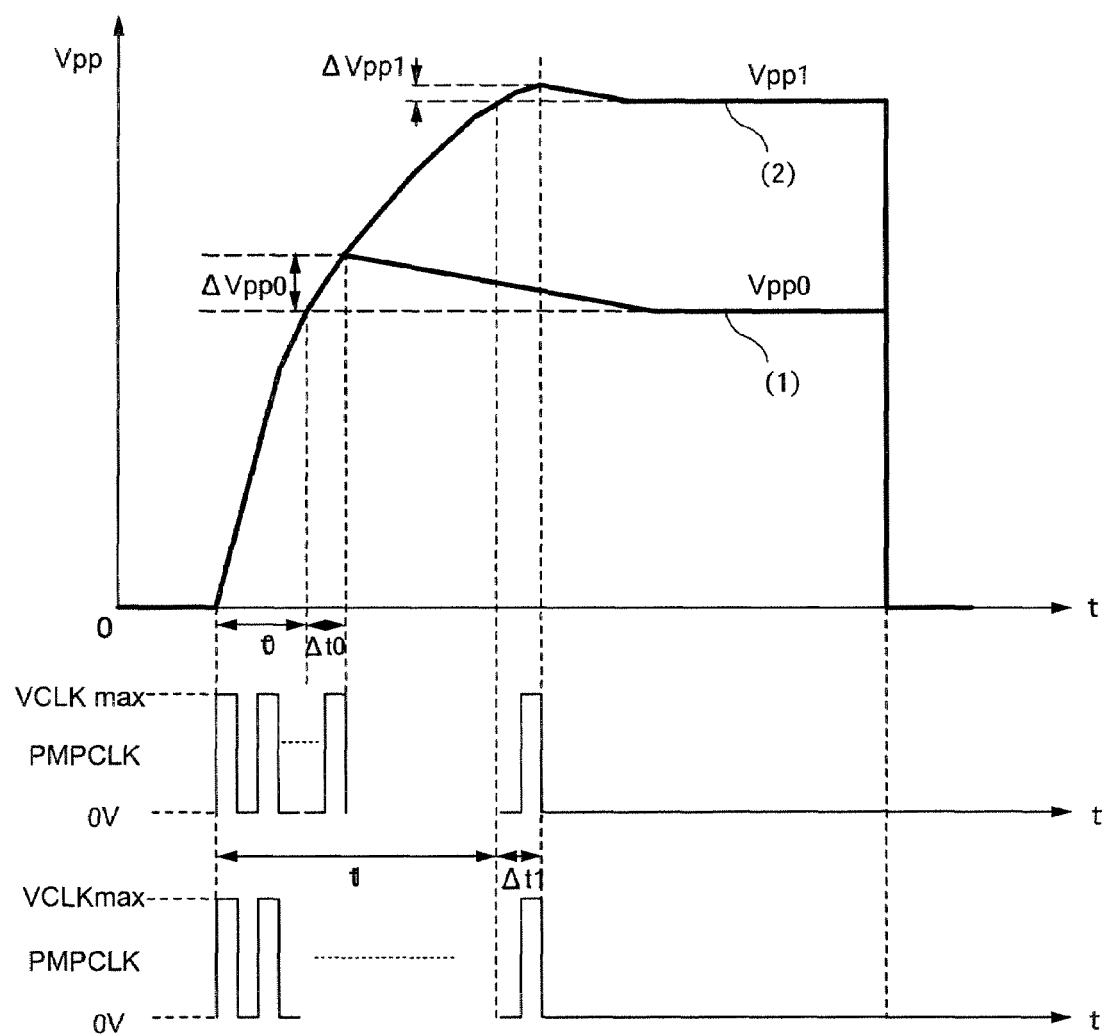
FIG. 5 is a graph which shows;
1) the time change of the output of the pulse generation circuit (high voltage generation circuit) in the case where the target output voltage is Vpp0 in a commonly used pulse generation circuit which uses a charge pump circuit and a limiter circuit, and
2) the time change of the output of the pulse generation circuit in the case where the target output voltage is Vpp1.

Here, FIG. 5 is referred to. FIG. 5 shows graphs of: (1) the time change of the output of a pulse generation circuit (a high voltage generation circuit) in the case where a target output voltage is Vpp0 and (2) the time change of the output of the pulse generation circuit (the high voltage generation circuit) in the case where a target output voltage is Vpp1 in a commonly used pulse generation circuit which uses a charge pump circuit and a limiter circuit. In the graphs shown in FIG. 5, an overshoot voltage is indicated as ΔVpp0 where a requested target output voltage is set at Vpp0. The graphs also indicate an overshoot voltage as ΔVpp1 where a requested target output voltage is set at Vpp1. Also, in the case where a requested target output voltage is set at Vpp0, the time from the point when the pulse generation circuit operates to the point when the requested target output voltage reaches Vpp0 is defined as t0, and the delay time from the point when the limiter circuit detects that the requested target output voltage Vpp0 has been obtained to the point when the pump circuit is stopped is defined as Δt. Also, in the case where the requested target output voltage is set at Vpp1, the time from the point where the pulse generation circuit operates to the point where the requested target output voltage reaches Vpp1 is defined as t1, and the delay time until the limiter circuit detects that the requested target output voltage Vpp1 has been obtained and the pump circuit is stopped is defined as Δt1. Further, in the commonly used pulse generation circuit which comprises a pump circuit and a limiter circuit and the time change in output voltage of which is indicated in FIG. 5, regardless of the fluctuation in the level of the target output voltage, a clock of a predetermined amplitude voltage (generally, a clock of the maximum amplitude (PMPCLK)) is input into the charge pump circuit.

As shown in FIG. 5, the pulse generation circuit generates a certain amount of overshoot voltages of ΔVpp0 and ΔVpp1. This is because by the time the clock of the pulse generation circuit is stopped after the target output voltage level is detected by the limiter circuit the delay time Δt0 or Δt1 occurs (Δt0=Δt1=Δt) and during the delay time Δt the pulse generation circuit continues to operate and as a result the output voltage exceeds the required target output voltage.

Also, as shown in FIG. 5, the overshoot voltage ΔVpp0 in the case when the target output voltage is low (i.e., the target output voltage is Vpp0 as shown in graph (1)) is large when compared to the overshoot voltage ΔVpp1 in the case when the target output voltage is high (i.e., the target output voltage is Vpp1 as shown in graph (2)). Also, because the times until the target output voltages are reached are different between the case when the target output voltage is low and the case when it is high, the time which is necessary for the output voltage to reach the required target output voltage is different depending on the required target output voltage, a characteristic variation is caused to appear in the application for which the target output voltage is used. Further, the lower the target output voltage, the more excessive the charge pumping capability of the high voltage generation circuit becomes and as a result an excess of electric current is consumed. If, for example, a pulse generation circuit which has the problems described above is used in a nonvolatile semiconductor memory device of this invention, a gap in the expected value of the target output voltage caused by the overshoot occurs and also because the times until the target output voltages are reached are different between the case when the target output voltage is low and the case when it is high, the program, erasure and read-out times of each cell will vary and as a result the memory cell program characteristic, erasure characteristic and read-out characteristic will vary.

A pulse generation circuit of this embodiment to realize a data program operation of a nonvolatile semiconductor memory device related to one embodiment of the present invention is explained blow.

Figure 6:
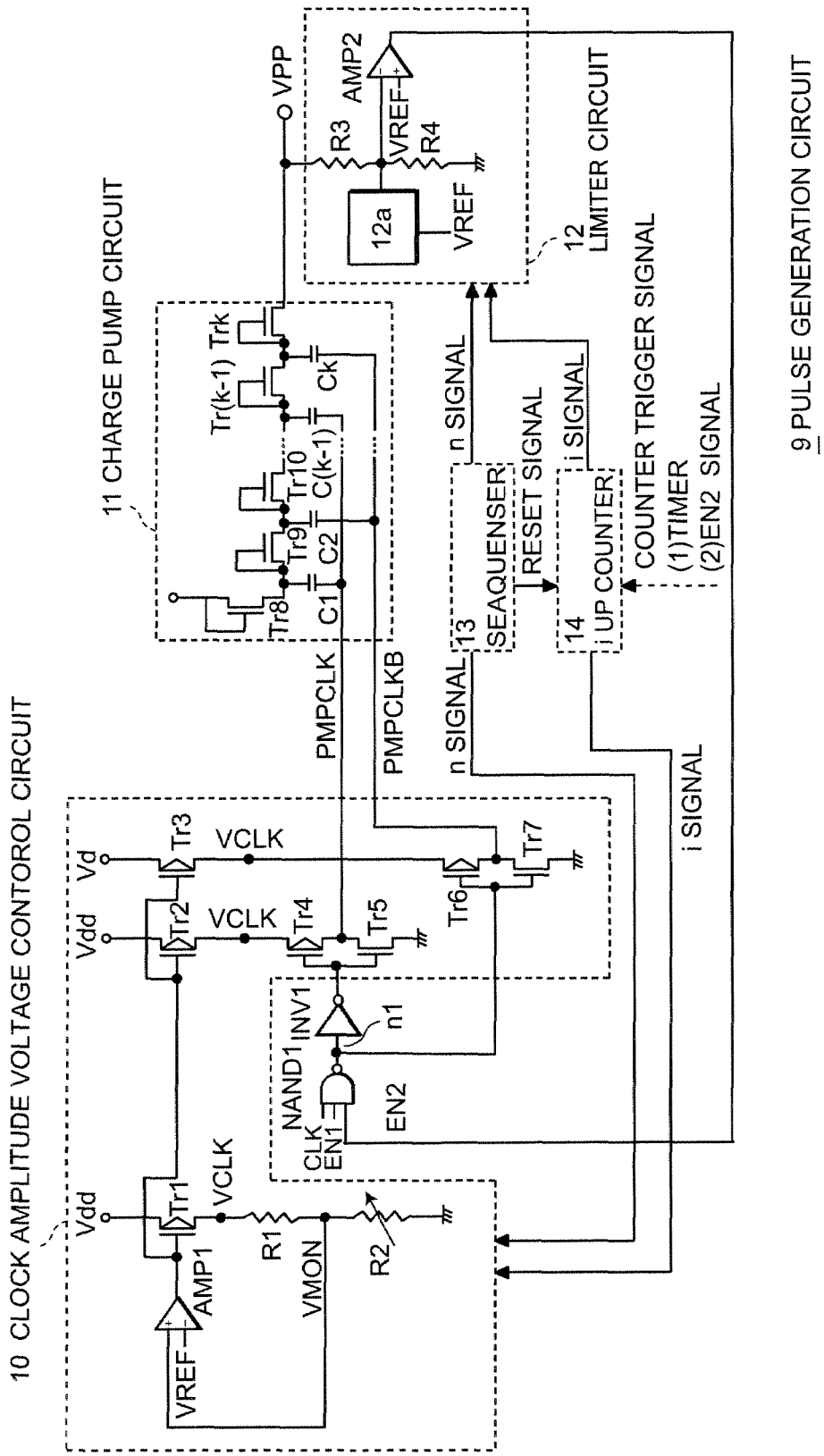
FIG. 6 is a circuit construction diagram of a pulse generation circuit 9 (high voltage generation circuit) related to one embodiment of a nonvolatile semiconductor memory device of this invention.

FIG. 6 is referred to. FIG. 6 shows a circuit diagram of a construction of a pulse generation circuit 9 (a high voltage generation circuit) related to this embodiment. Pulse generation circuit 9 is composed of 5 separate parts: a clock amplitude voltage control circuit 10, a charge pump circuit 11, a limiter circuit 12, a sequencer 13 and an i up-counter.

When compared to a commonly used pulse generation circuit which uses a pump circuit and a limiter circuit which causes the aforementioned problems, the pulse generation circuit 9 of the present embodiment changes the charge pumping capability in accordance with the height of the target output voltage. In other words, the pulse generation circuit 9 related to this embodiment has a construction so that the higher the target output voltage level becomes, the higher the clock amplitude voltage is selected and input into the charge pumping circuit 11 and the lower the target output voltage level becomes the lower the clock amplitude voltage is selected and input into the charge pumping circuit 11.

Figure 7:
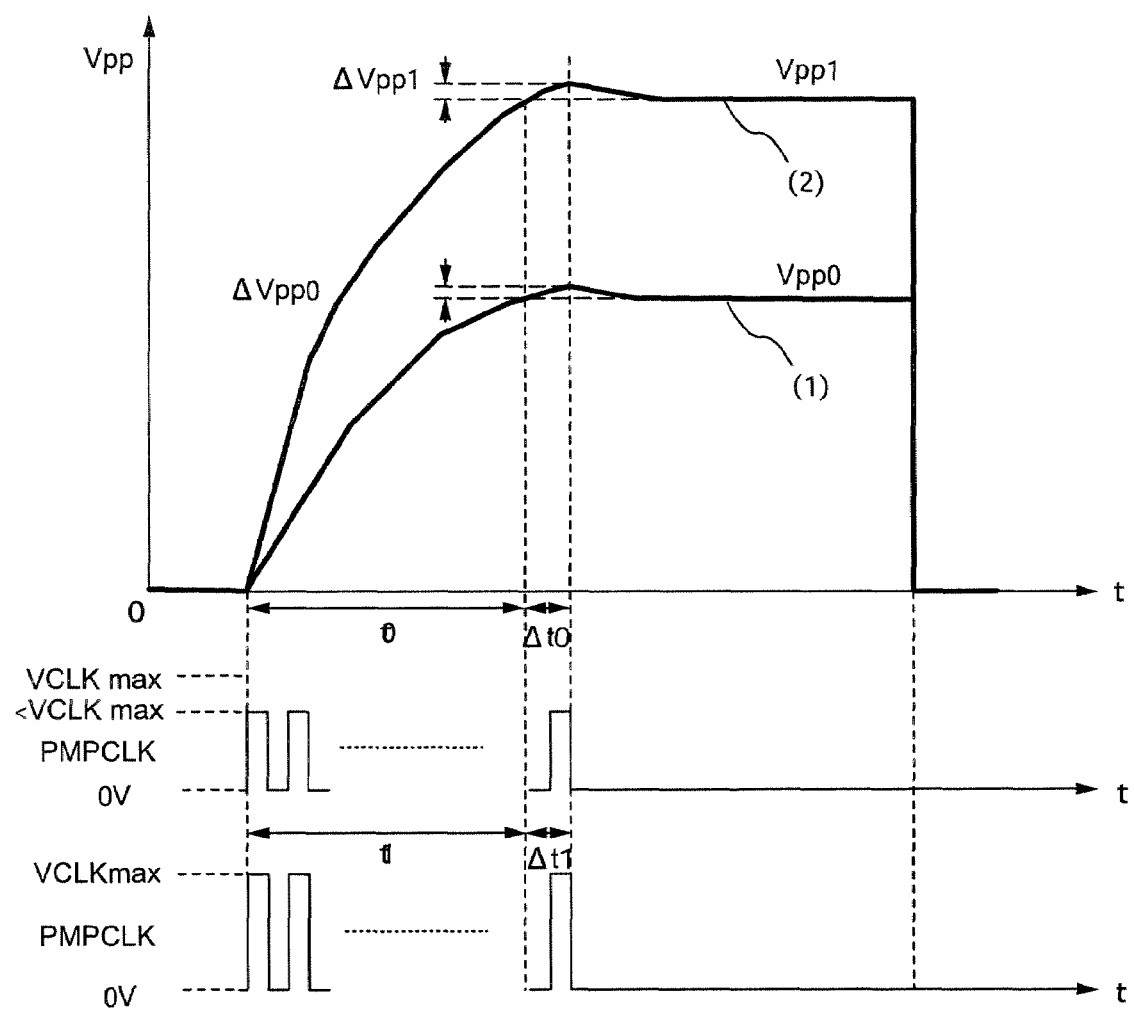
FIG. 7 is a graph which shows;
1) the time change of the output of a pulse generation circuit 9 in the case where the target output voltage is Vpp0 in a pulse generation circuit 9 related to one embodiment of this invention,
2) the time change of the output of a pulse generation circuit 9 in the case where the target output voltage is Vpp1 in a pulse generation circuit 9 related to one embodiment of this invention.

Here, FIG. 7 is referred to. FIG. 7 is a graph which shows (1) the time change of the output of the pulse generation circuit 9 when the target output voltage is Vpp0 and (2) the time change of the output of the pulse generation circuit 9 when the target output voltage is Vpp1 in the pulse generation circuit 9 related to the present embodiment. Similar to FIG. 5, the graph shown in FIG. 7 shows (1) the time change of the output of the pulse generation circuit 9 related to the present embodiment when the target output voltage is Vpp0 and (2) the time change of the output of the pulse generation circuit 9 related to the present embodiment when the target output voltage is Vpp1. In the graph shown in FIG. 7, when the requested target output voltage is set at Vpp0 the overshoot voltage over Vpp0 is shown as ΔVpp0. Also, when the requested target output voltage is set at Vpp1 the overshoot voltage over Vpp1 is shown as ΔVpp1. Also, in the case where the requested target output voltage is set at Vpp0, the time from the point when the pulse generation circuit 9 of the present embodiment operates to the point when the requested target output voltage reaches Vpp0 is shown as t0, the delay time from when the limiter circuit 12 detects that the requested target output voltage Vpp0 has been reached until the pump circuit 11 is stopped is shown as Δt0. Also, in the case where the requested target output voltage is set at Vpp1, the time from when the pulse generation circuit 9 operates to the point when the requested target output voltage reaches Vpp1 is shown as t1, the delay time from when the limiter circuit 12 detects that the requested arrival target voltage Vpp1 has been reached until the pump circuit 11 is stopped is Δt1.

As shown in FIG. 7, certain amounts of overshoot voltages of ΔVpp0 and ΔVpp1 emerge by the pulse generation circuit 9 related to the present embodiment. This is because the delay time Δt0 or Δt1 from the point when the target output voltage level is detected by the limiter circuit to the point when the time the clock of the pulse generation circuit 9 is stopped occurs (Δt0=Δt1=Δt) and during that delay time Δt the pulse generation circuit 9 continues to operate and as a result the output voltage exceeds the required target output voltage.

In the pulse generation circuit 9 related to the present embodiment several amplitude voltage clocks which are input into the charge pump circuit 11 are provided and in accordance with the requested target output voltage, the amplitude voltage of the clocks is changed and input into charge pump circuit 11. In the example shown in FIG. 7, when the requested target output voltage is Vpp0 a clock which has a smaller amplitude voltage (<VCLKmax) than the maximum value of the clock amplitude voltage is input into charge pump circuit 11, when the requested target output voltage is Vpp1, the clock which has the maximum amplitude voltage value (=VCLKmax) is input into charge pump circuit 11.

By doing this, in the pulse generation circuit 9 related to the present embodiment the higher the target output voltage level is the higher is the charge pumping capability, and the lower the target output voltage level is the lower the charge pumping capability becomes. As a result, as shown in FIG. 7, without depending on the target output voltage level the overshoot voltage becomes an approximately constant value (ΔVpp0≈ΔVpp1) and the overshoot voltage can be kept low. Also, the time until the target output voltage is reached becomes approximately constant (Δt1≈Δt2). Further, it is possible to prevent consuming excessive consumption of electric current.

In the pulse generation circuit 9 of the present embodiment, a clock signal CLK, an enable signal EN1 and an enable signal EL2 are input into a NAND circuit (NAND1). Only when both the enable signal EN1 and the enable signal EN2 are Hi, the clock signal CLK is output to a clock amplitude voltage control circuit 10 through an inverter INV1.

The clock amplitude voltage control circuit 10 has an amp AMP1, transistors Tr1~Tr7, a resistor R1 and a variable resistor R2. In the amp AMP1 a reference power supply VREF is input and the gate voltages of transistors Tr1~Tr3 become stable voltages for maintaining the formula (2) below in accordance with voltage Vdd. In this clock amplitude voltage control circuit 10, by changing the resistance value of the variable resistor R2 (or variable resistor R1, or (1+R1/R2) or VREF) in accordance with the required target output voltage (VPP1 and VPP2) it is possible to obtain the decided prescribed amplitude clock voltage VCLK (VCLK1 and VCLK2) through the formula (2) below.

$$VCLK=(1+R1/R2) \times VREF \quad (2)$$

This clock voltage VCLK in the pulse generation circuit 9 related to the present embodiment shown in FIG. 6 does not depend on the external power supply Vdd and has a predetermined amplitude corresponding to the required target output voltage (where VCLK<Vdd). By changing the resistance value of the variable resistor R2 (or variable resistor R1, or (1+R1/R2) or VREF) in accordance with the required target output voltage it is possible to keep the arrival time constant without depending on the level of the target output voltage. In other words, the higher the target output voltage is, the nearer the voltage to the power supply voltage Vdd is selected and the lower the level of the target output voltage the farther away the voltage from Vdd is selected respectively. By this, the arrival time can approximately be maintained constant without depending on the level of the target output voltage (t0≈t1) and the output overshoot and ripple can be controlled. Also, according to necessity, it is possible to make consumption of power smaller.

The charge pump circuit 11 has transistors Tr8~Tr(k−1), Trk (k is an optional integer according to necessity) and condensers C1~C(k−1), Ck (k is an optional integer according to necessity). In the source (drain) of Tr8 the supply voltage (for example Vcc) to the charge pump circuit is applied. Also, at one end of an odd numbered condenser C1, C3 . . . C(k−1) a clock signal PMPCLK which is controlled by the amplitude of the clock amplitude voltage control circuit 10 is input. Also, at the end of an even numbered condenser C2, C4, . . . Ck, similarly PMPCLKB is input. Further, PMPCLK and PMPCLKB are in an opposite phase relationship.

The charge pump circuit 11 generates a program voltage Vpp based on the input clock signal PMPCLK and its opposite phase signal PMPCLKB.

For the charge pump circuit 11, for example, Dickson's charge pump circuit (J. F. Dickson, "On-chip high voltage generation in NMOS integrated circuits using an improved voltage multiplier technique", IEEE J. Solid-State Circuits, vol. SC-11, pp. 374-378, June 1976) is a good reference.

The limiter circuit 12 has an amp AMP2, resistors R3 and R4 and a resistance dividing circuit 12a. In the limiter circuit 12 the n signal which indicates that the $n^{th}$ series of program pulses is input from a sequencer 13 and the i signal which indicates that the $i^{th}$ program pulse is input in one series of the program pulses is input in the limiter circuit 12. Further, as a trigger signal to increment the i signal, it is possible to use an EN2 signal or a timer. The limiter circuit 12 is a circuit to generate a predetermined value of Vpp by setting the enable signal EN2, which is output by the amp AMP2, to Lo and by stopping the supply of the clock signal PMPCLK and its opposite phase signal PMPCLKB to the charge pump circuit.

Figure 8:
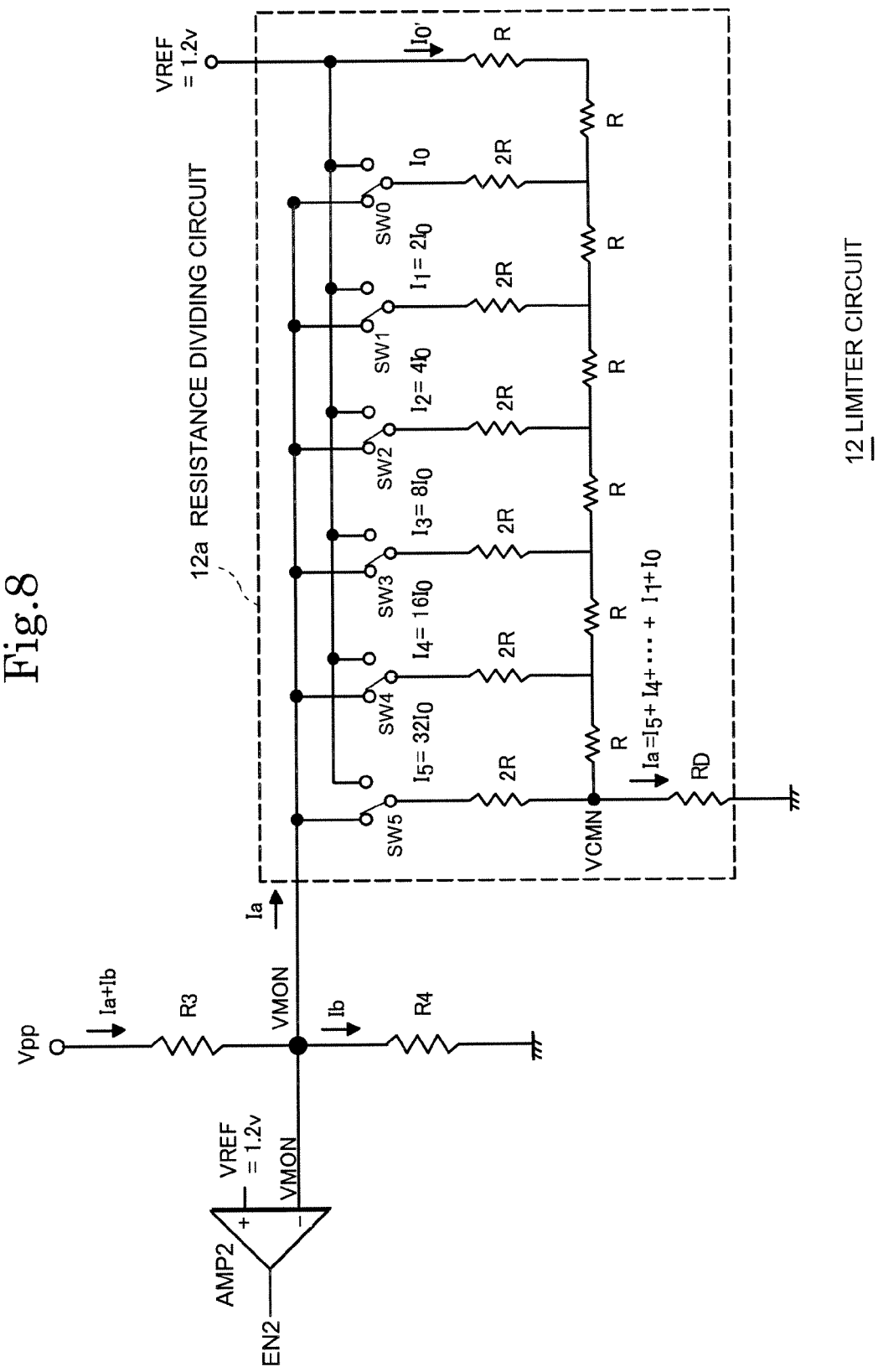
FIG. 8 is a circuit construction diagram of a limiter circuit 12 related to one embodiment of a nonvolatile semiconductor memory device of this invention.

Here, FIG. 8 is referred to. In FIG. 8 a circuit construction of the limiter circuit 12 in the present embodiment is shown. As shown in FIG. 8 a resistance dividing circuit 12a of the limiter circuit 12 has switch circuits SW0~SW5 and resistors corresponding to these switch circuits. In FIG. 8, the electric current which flows through the resistors corresponding to SW0~SW5 are each defined as $I_0$-$I_5$. As shown in FIG. 8, among $I_0$~$I_5$ a relationship is established with $I_1=21_0$, $I_2=41_0$, $I_3=81_0$, $I_4=161_0$, $I_5=321_0$. Also, the electric current flowing through resistor R3 is defined as (Ia+Ib) and the current flowing through resistor R3 is defined as Ib. Also, as shown in FIG. 8, the electric current which flows through resistor R supplied by VREF without passing through any switch is defined as $I_0'$.

In the present embodiment, among the switches SW0~SW5 of the resistance dividing circuit 12a, the switches SW2~SW5 are controlled by the n signal which indicates that the present series is the $n^{th}$ series of program pulses, the switches SW0~SW1 are controlled by the i signal which indicates that the present pulse is the $i^{th}$ program pulse in one series of program pulses. That is to say, in the present embodiment, $0 \leq n \leq 15$, $0 \leq t \leq 3$.

As stated above, the output voltage of the program pulse Vpp, which is output from the charge pump circuit 11, is controlled by the limiter circuit 12 and its overshoot and ripple are suppressed by the clock amplitude voltage control circuit 10. This voltage Vpp is applied to the control gate of a memory cell. Further, Vpp, which is wave shaped controlled by the pulse generation circuit 9, and the voltage Vcg, which is applied to the control gate of a memory cell, are the same here.

The output Vpp of the clock amplitude voltage control circuit 10 is calculated by the formula below.

$$Ia=0 \quad (1)$$

$$Vpp=VMON+Ib \times R3 \quad (3)$$

$$Ib=VMON/R4 \quad (4)$$

$$Vpp=(1+R3/R4) \times VMON=(1+R3/R4) \times VREF \quad (5)$$

$$Ia>0 \quad (6)$$

-continued
$$\begin{aligned} Vpp &= VMON + (Ib + Ia) \times R3 \\ &= Vpp0 + Ia \times R3 \\ &= Vpp0 + R3(32 + 16 + \ldots + 2 + 1)/(64(R + R_D)) + MON \\ &= [(1 + R3/R4) + \\ &\quad R3(32 + 16 + \ldots + 2 + 1)/(64(R + R_D))] \times REF \end{aligned}$$

When (1) Ia=0, Vpp follows formula (5). This Vpp becomes Vpp0 (the program pulse initial value).

When (2) Ia>0, Vpp follows formula (6). The first term on the right of formula (5) corresponds to Vpp0 (the program pulse initial value) and the second term on the right corresponds to the step-up width ΔVpp between the series of program pulses and the step-up width (i/mXΔVpp) of the program pulse based on the i signal and n signal.

In this way, a prescribed program pulse based on the n signal and i signal is generated and applied to the control gate of a memory cell.

Further, the switches SW0~SW5 and the values and number of resistors which correspond to them are not limited to the numbers shown in the present embodiment and can be changed appropriately at the design time. For example, in the case of $0 \leq n \leq 31$, $0 \leq t \leq 7$ the switches SW0~SW7 are installed, SW3~SW7 can be controlled by the n signal and SW0~SW2 can be controlled by the i signal.

Here, in a nonvolatile semiconductor memory device related to one embodiment of this invention, the required target output voltages (Vpp0, Vpp1 etc) and the relationship of the clock voltage amplitudes which have predetermined amplitudes corresponding to the required target output voltages, are explained using FIGS. 9 to 14. While in a nonvolatile semiconductor memory device related to one embodiment of this invention, the clock voltage amplitudes which have predetermined amplitudes corresponding to the required target output voltages shown in FIGS. 9 to 14 are set, it is not limited to this.

Figure 9:
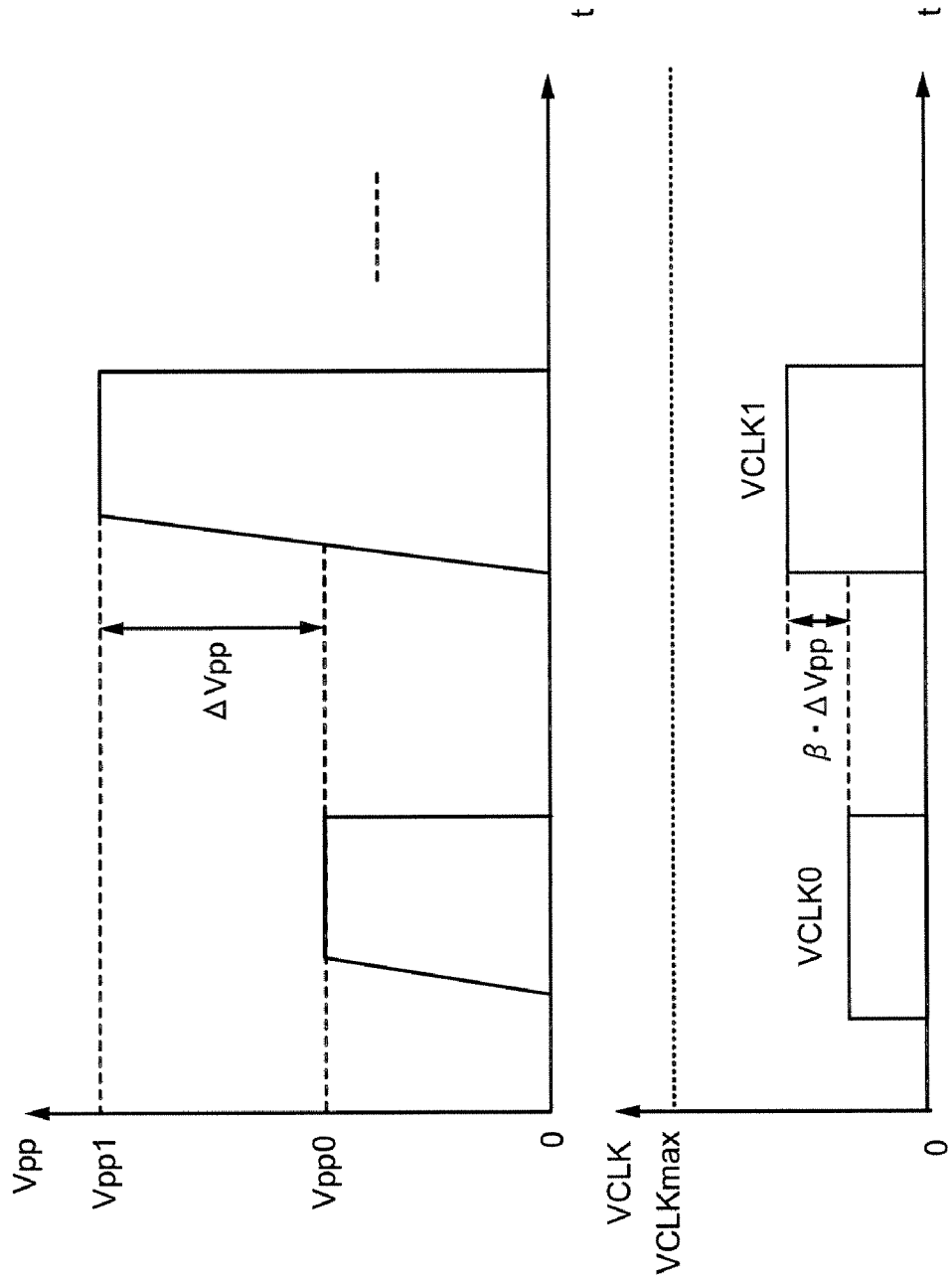
FIG. 9 is a graph which shows a relationship between a required target output voltage (Vpp0, Vpp1 etc.) and a clock voltage amplitude having a predetermined amplitude corresponding to the required target output voltage related to one embodiment of a nonvolatile semiconductor memory device of this invention.

Between the charge pumping capability of the charge pump circuit 11 and the clock voltage amplitude which is used in the charge pump circuit there is a fixed relationship (basically a proportion relationship). As shown in FIG. 9, in the setting of the clock voltage amplitude which has a fixed amplitude corresponding to the required target output voltage, when the clock amplitude voltage in the case when the target output voltage rises up to a low level (Vpp0) is given by VCLK0, by summing up to VCLK0 the value (β×ΔVpp), which is calculated by multiplying a constant parameter β and ΔVpp, which is a variable part of the target output voltage from Vpp0 to Vpp1, it is possible to obtain the clock voltage VCLK1 when the target output voltage rises up to a high level (Vpp1).

The relationship related to the setting of the clock voltage amplitude which has a prescribed amplitude corresponding to the required target output voltage shown in FIG. 9 follows the formulas (7)~(9) below.

$$Vpp0 = \Delta \times VCLK0 \quad (7)$$

$$Vpp1 = Vpp0 + \Delta Vpp \quad (8)$$

$$VCLK1 = VCLK0 + \beta \times \Delta Vpp \quad (9)$$

Next, FIG. 10 is referred to. FIG. 10 exemplifies a case in which the clock amplitude voltage continues to change according to the output voltage as well as during the time period until the target output voltage is obtained (during Vpp is rising).

The program pulse timing charts are as shown in FIGS. 11 to 14 in the case where the required target output voltage, which is explained by referring to FIGS. 9 and 10, and the setting of the clock voltage amplitude, which has a predetermined amplitude corresponding to the required target output voltage, are used in a nonvolatile semiconductor memory device related to one embodiment of this invention.

Figure 11:
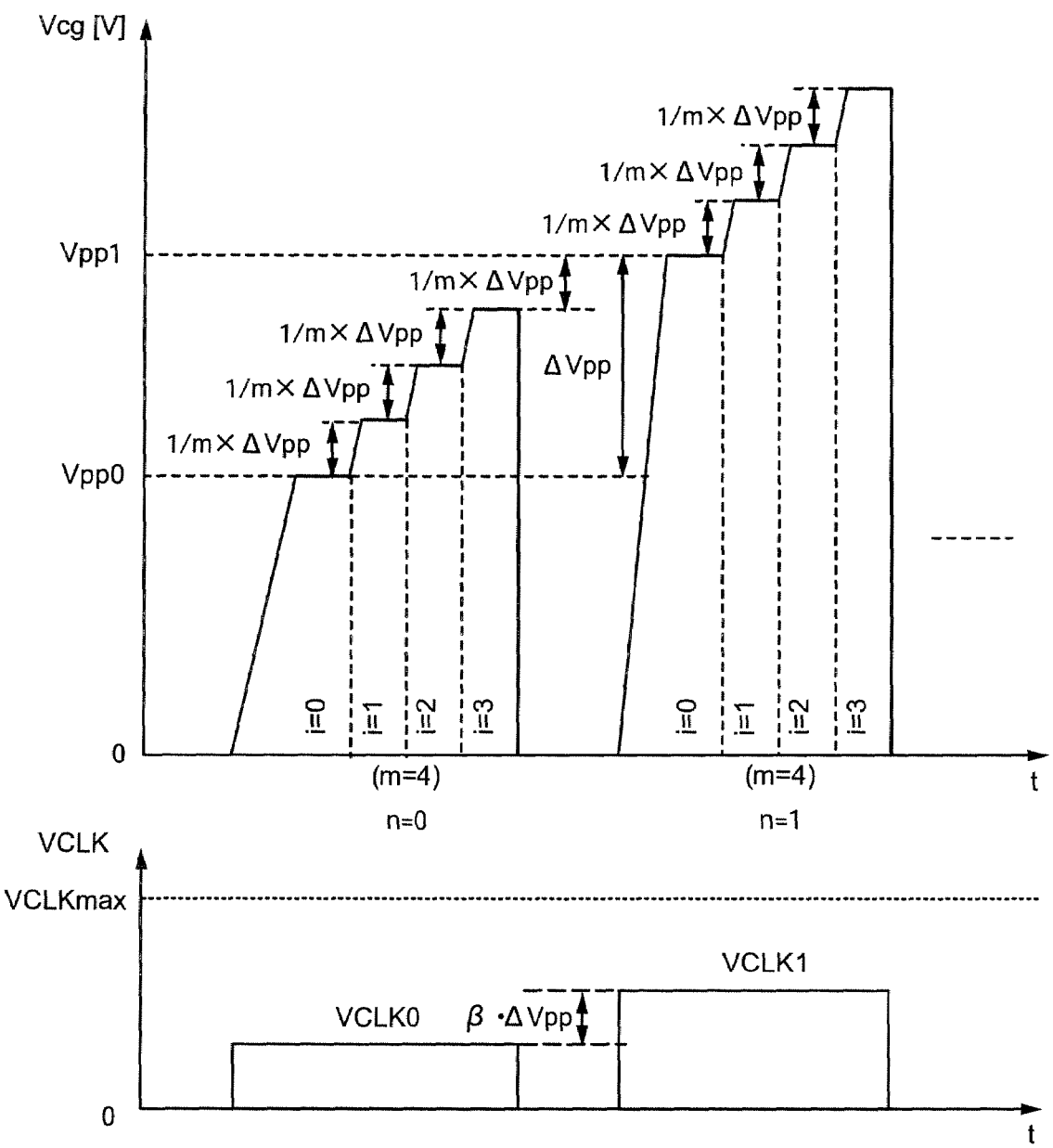
FIG. 11 is a timing chart of a program pulse which is applied to a control gate 1 in one embodiment of a nonvolatile semiconductor memory device of this invention.

FIG. 11 shows a program pulse timing chart in the case where the setting of the clock voltage amplitude which has a predetermined amplitude corresponding to the required target output voltage as shown in FIG. 9 is used in a nonvolatile semiconductor memory device related to one embodiment of this invention.

Figure 12:
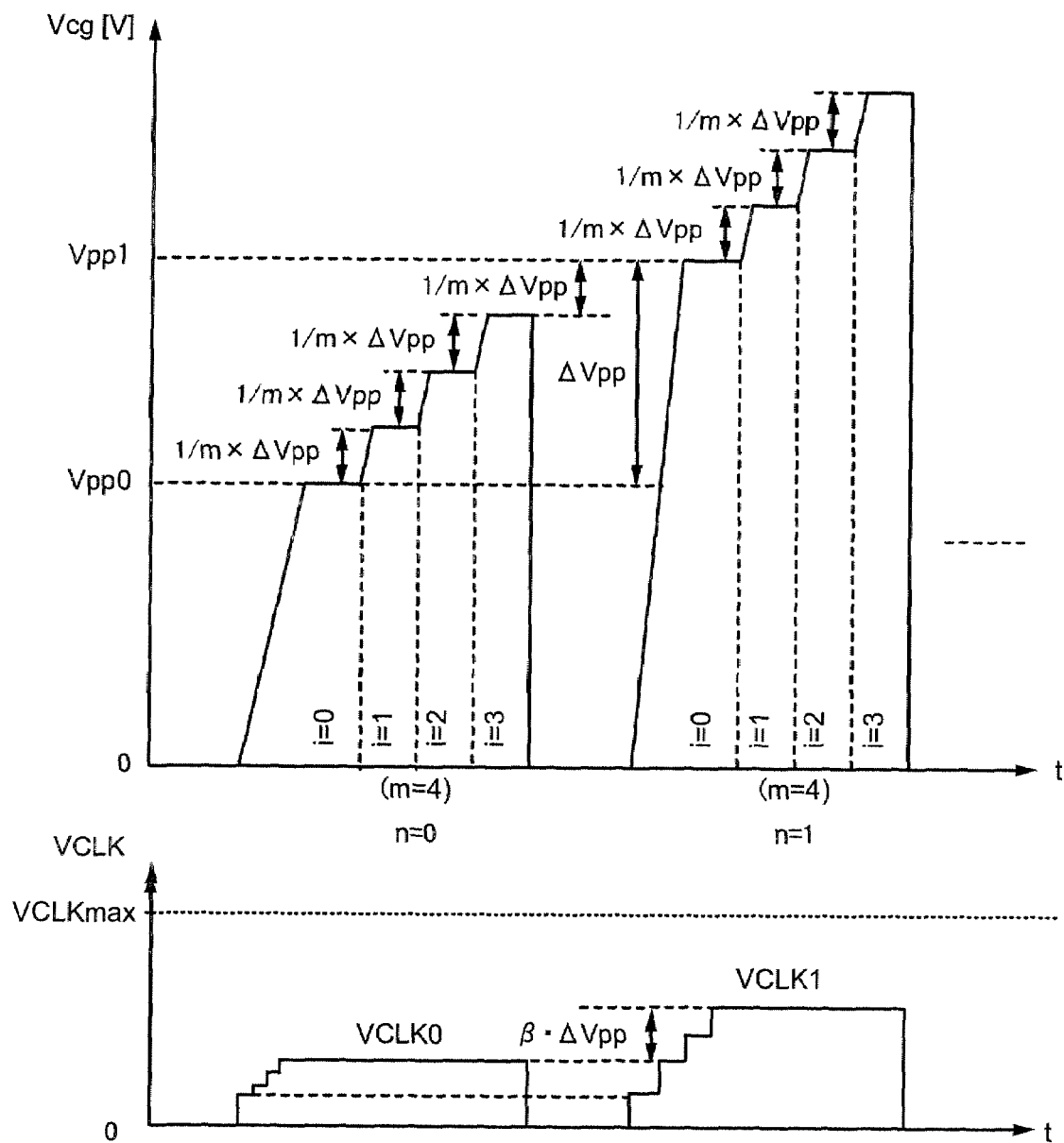
FIG. 12 is a timing chart of a program pulse which is applied to a control gate 1 in one embodiment of a nonvolatile semiconductor memory device of this invention.

FIG. 12 shows a program pulse timing chart in the case where the setting of the clock voltage amplitude which has a predetermined amplitude corresponding to the required target output voltage as shown in FIG. 10 is used in a nonvolatile semiconductor memory device related to one embodiment of this invention.

Figure 13:
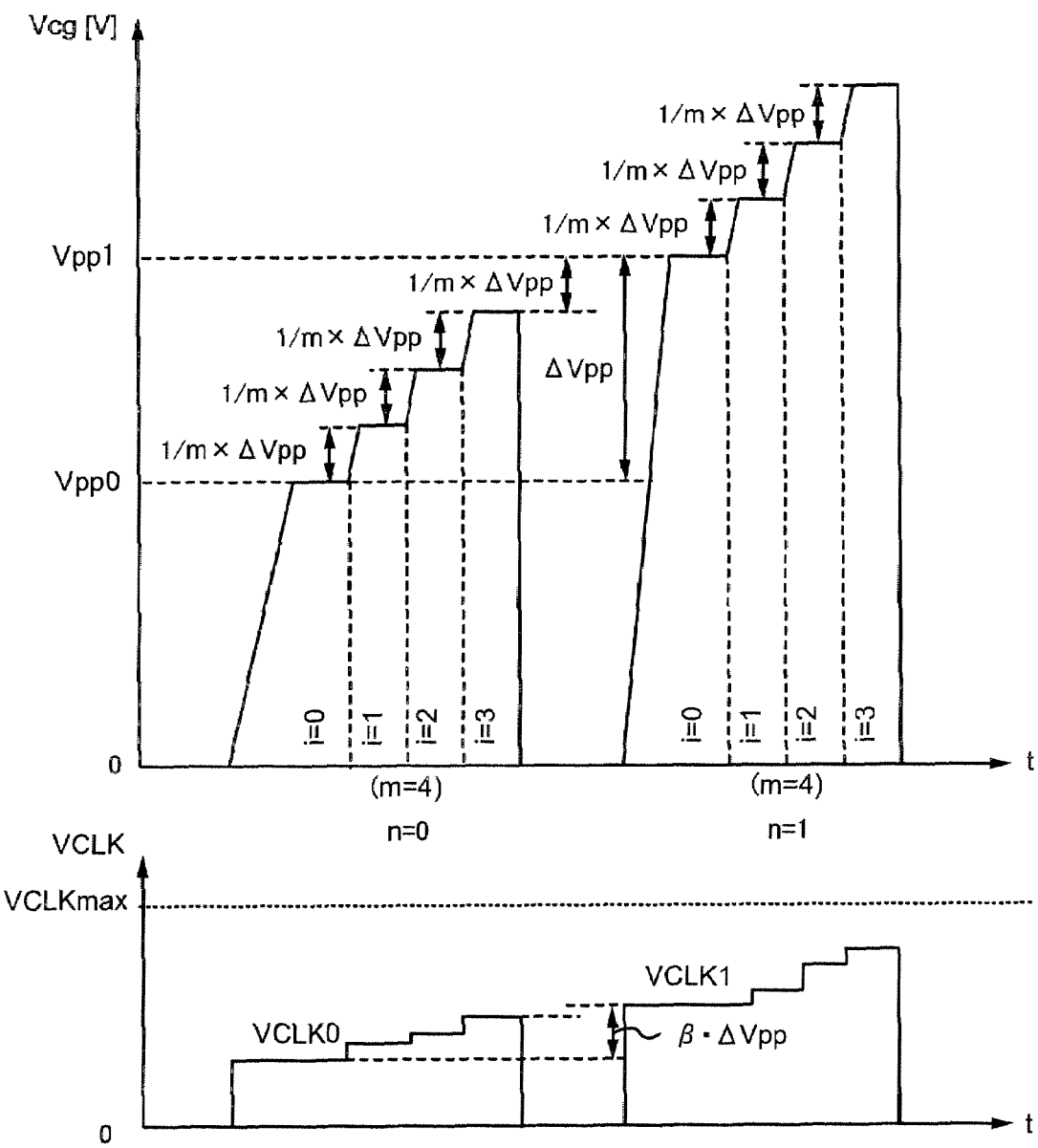
FIG. 13 is a timing chart of a program pulse which is applied to a control gate 1 in one embodiment of a nonvolatile semiconductor memory device of this invention.

FIG. 13 shows a program pulse timing chart in the case where a fixed amplitude corresponding to the required arrival output voltage, as shown in FIG. 11, a setting of the clock voltage amplitude which changes the clock voltage amplitude corresponding to the step-up width of the program pulse in a certain series of program pulses is used in a nonvolatile semiconductor memory device related to one embodiment of this invention in addition to the setting of the clock voltage amplitude which has a predetermined amplitude corresponding to the required target output voltage as shown in FIG. 11.

Figure 14:
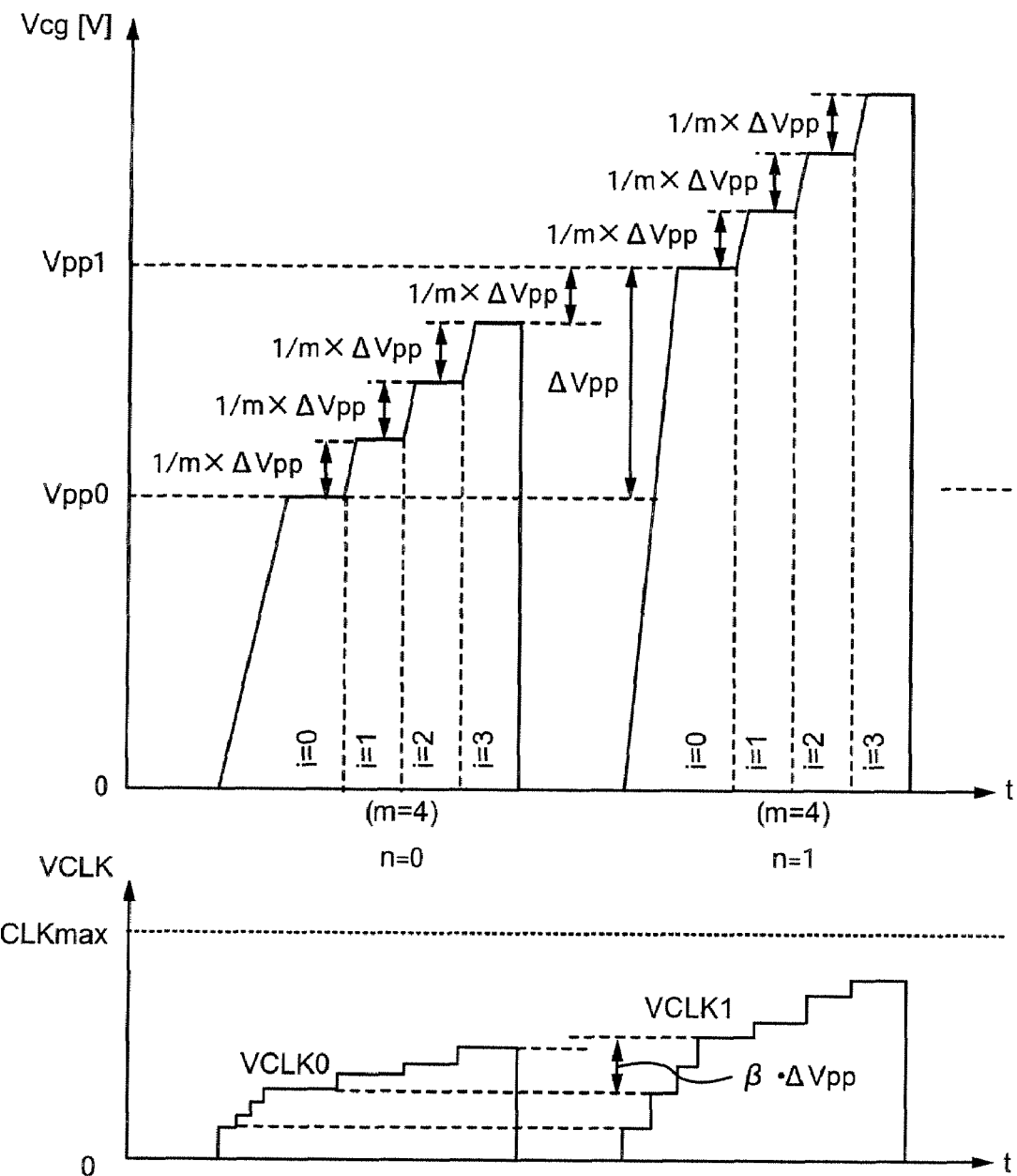
FIG. 14 is a timing chart of a program pulse which is applied to a control gate 1 in one embodiment of a nonvolatile semiconductor memory device of this invention.

FIG. 14 shows a program pulse timing chart in the case where a predetermined amplitude corresponding to the required target output voltage, as shown in FIG. 12, a setting of the clock voltage amplitude which changes the clock voltage amplitude corresponding to the step-up width of the program pulse in a certain series of program pulses is used in a nonvolatile semiconductor memory device related to one embodiment of this invention in addition to the setting of the clock voltage amplitude which has a predetermined amplitude corresponding to the required target output voltage as shown in FIG. 12.

The clock voltage amplitudes shown in FIGS. 11 to 14 can be realized by changing (controlling) the variable resistor R2 (or variable resistor R1, or (1+R1/R2) or VREF) according to necessity and following the above stated formula (2).

According to a nonvolatile semiconductor memory device and an operation method thereof related to the present embodiment of this invention, by simply adding a simple circuit a reduction in data program time can be realized. Also, according to a nonvolatile semiconductor memory device and an operation method thereof related to the present embodiment of this invention, by simply adding an simple circuit, increasing the potential of the program pulse little by little by increments of the step-up width $\Delta Vpp$ in a series of the program pulses can be realized, the application of a precipitous electric field in a memory cell can be prevented in the succeeding series pulse after a verify operation and it is possible to control the degradation of a tunnel oxide film or break in insulation etc and it is possible to improve the reliability of a nonvolatile semiconductor memory device.

Also, in the present embodiment, it is possible to maintain the arrival time approximately constant without depending on the level of the target output voltage by changing the resistor value of the variable resistor R2 (or variable resistor R1, or (1+R1/R2) or VREF) which corresponds to the required target output voltage.

According to a nonvolatile semiconductor memory device and an operation method thereof related to one embodiment of this invention, a reduction of the time necessary for a data program operation can be realized. Also, according to the a nonvolatile semiconductor memory device and an operation method thereof related to one embodiment of this invention, by increasing the potential of program pulses little by little by the step-up width $\Delta Vpp$ in one series of program pulses, it is possible to prevent a precipitous electrical field being applied to a memory cell (a flow of precipitous tunnel current) in the succeeding series of program pulses after a verify operation and it is possible to control the degradation of a tunnel oxide film or break in insulation etc. and to improve the reliability of a nonvolatile semiconductor memory device.

EMBODIMENT 2

In the present embodiment, an example construction of a limiter circuit 12 which does not use a resistance dividing circuit 12a will be explained, said limiter circuit 12 being comprised in the pulse generation circuit 9 explained in FIGS. 6 and 8 in the above stated embodiment 1,.

Figure 15:
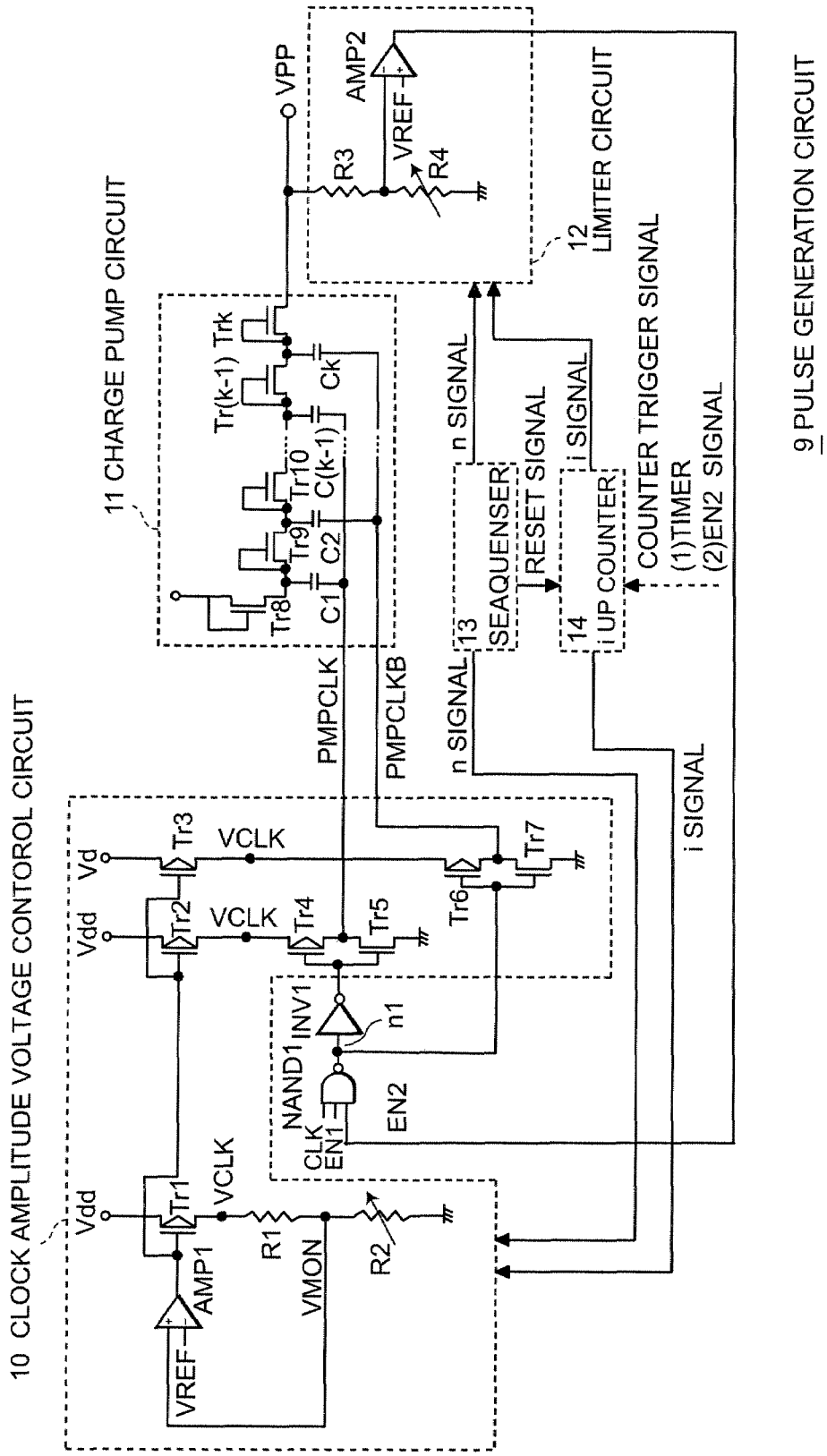
FIG. 15 is a circuit construction diagram of a pulse generation circuit 9 (a high voltage generation circuit) related to one embodiment of a nonvolatile semiconductor memory device of this invention.

FIG. 15 is referred to. In FIG. 15 a circuit construction of a pulse generation circuit 9 of this embodiment is shown. As shown in FIG. 15, the limiter circuit of the pulse generation circuit 9 of this embodiment is composed of a resistor R3, a variable resistor R4 and an amp AMP2. In this case, by changing the resistance value of the variable resistor R4 based on the n signal and the i signal it is possible to obtain the prescribed output Vpp. In this case, Vpp is decided by the formula (10) below. Further, resistor R3 can be made a variable resistor and R4 can be made a fixed resistor.

$$Vpp=(1+R3/R4)\times VREF \qquad (10)$$

Figure 16:
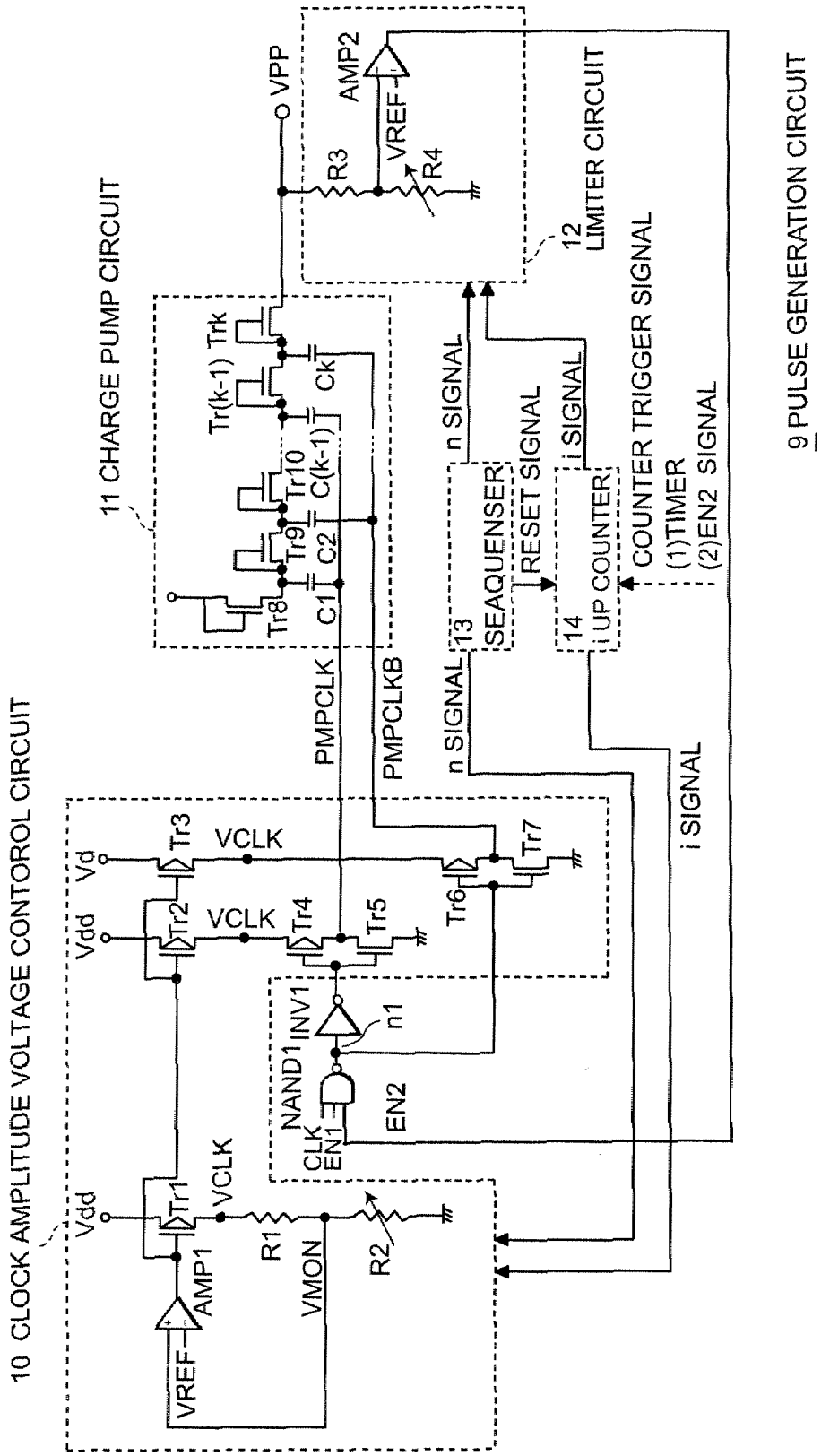
FIG. 16 is a circuit construction diagram of a pulse generation circuit 9 (a high voltage generation circuit) related to one embodiment of a nonvolatile semiconductor memory device of this invention.

Also, as shown in FIG. 16, the limiter circuit 12 can be composed without using resistance dividing circuit 12a and resistor R4 (or R3) can be made a fixed value resistor. In this case, by changing the reference power supply VREF and tuning based on the n signal and the i signal it is possible to obtain the prescribed output Vpp. In this case, Vpp is decided by the formula (10) stated above.

The limiter circuit explained in this embodiment has an extremely simple construction and by constructing a pulse generation circuit 9 using this, a simpler nonvolatile semiconductor memory device of this invention and its operation methods therein can be realized.

EMBODIMENT 3

In this embodiment, another example of a clock amplitude voltage control circuit 10 in the pulse generation circuit 9 used in one embodiment of this invention is explained. Further, regarding the clock amplitude voltage control circuit 10 of this embodiment, as the construction elements similar to those of the clock amplitude voltage control circuit 10 shown in FIG. 6 are not explained again here.

Figure 17:
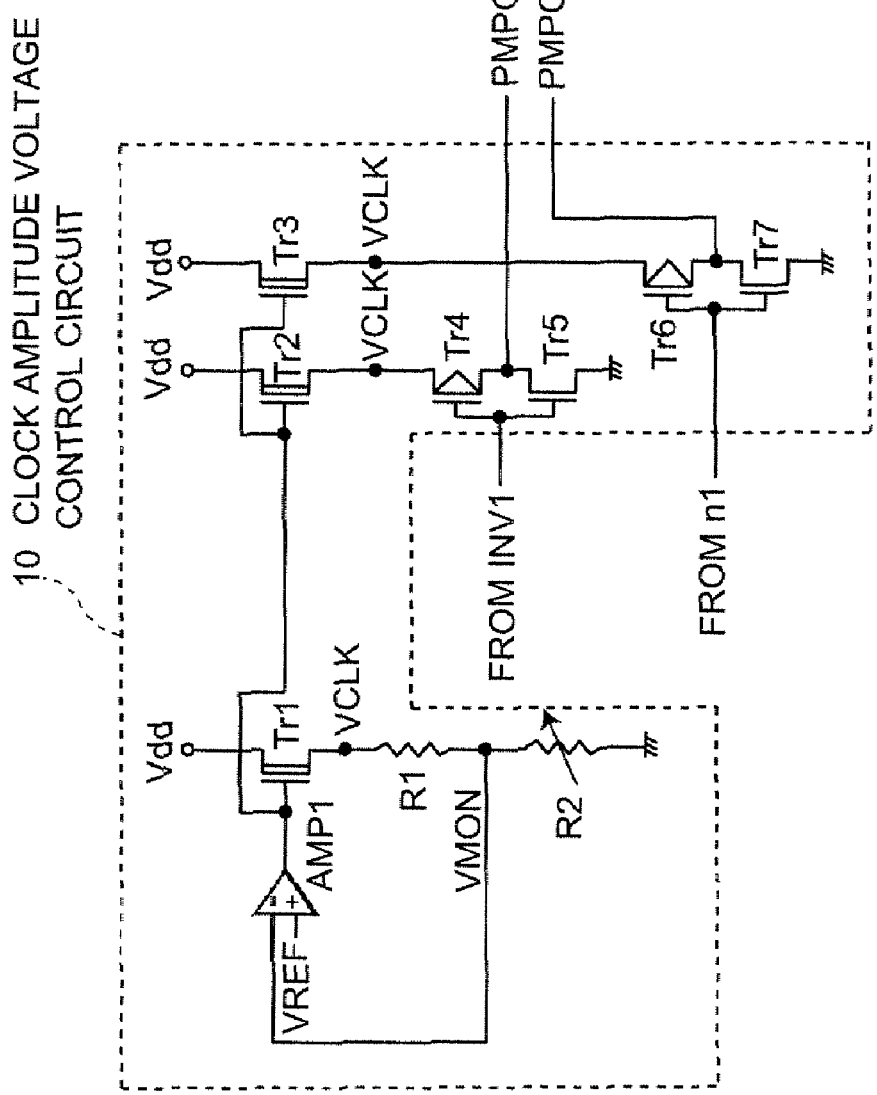
FIG. 17 is a diagram which shows a circuit construction of an amplitude voltage control circuit 10 related to one embodiment of this invention.

The clock amplitude voltage control circuit 10 related to one embodiment shown in FIG. 17 is constructed so that it has Tr1~Tr3 which are depression type N channel type transistors.

Figure 18:
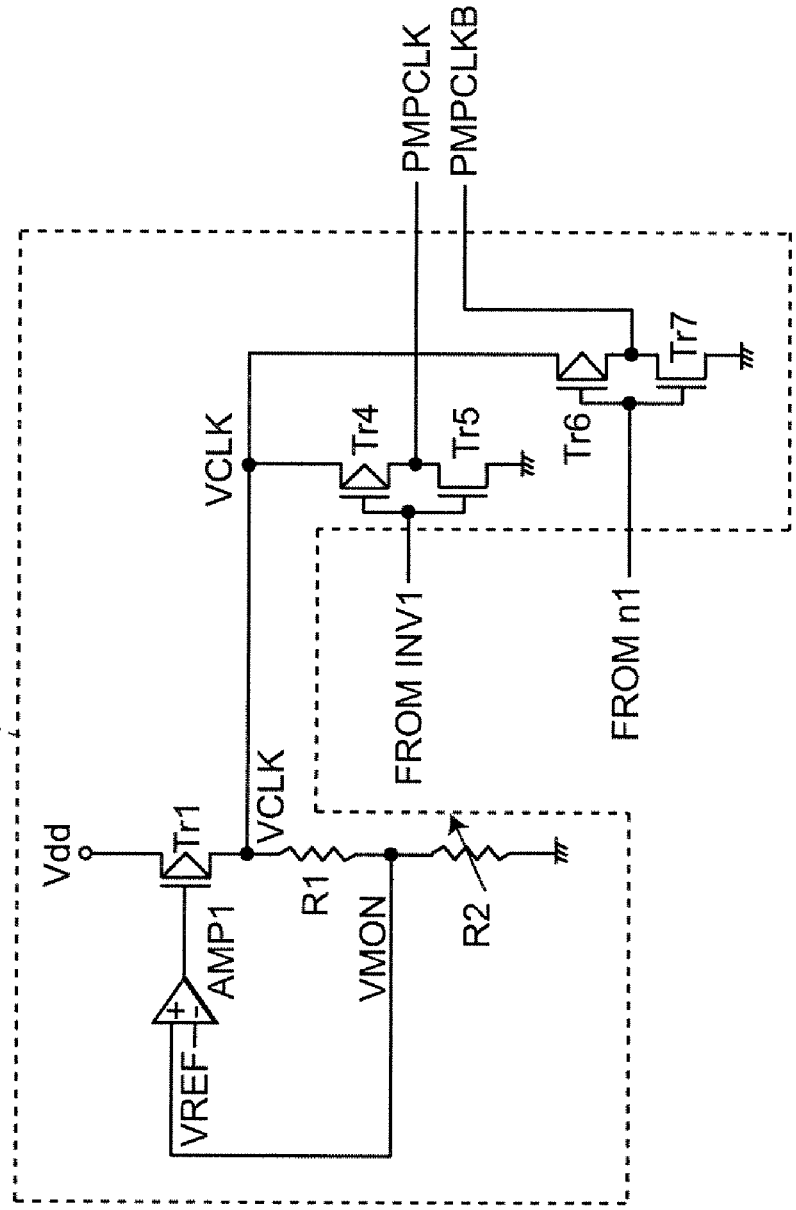
FIG. 18 is a diagram which shows a circuit construction of an amplitude voltage control circuit 10 related to one embodiment of this invention.

The clock amplitude voltage control circuit 10 related to one embodiment shown in FIG. 18 is constructed so that VLCK is supplied directly to the source of Tr4 (or Tr5) from Tr1.

Figure 19:
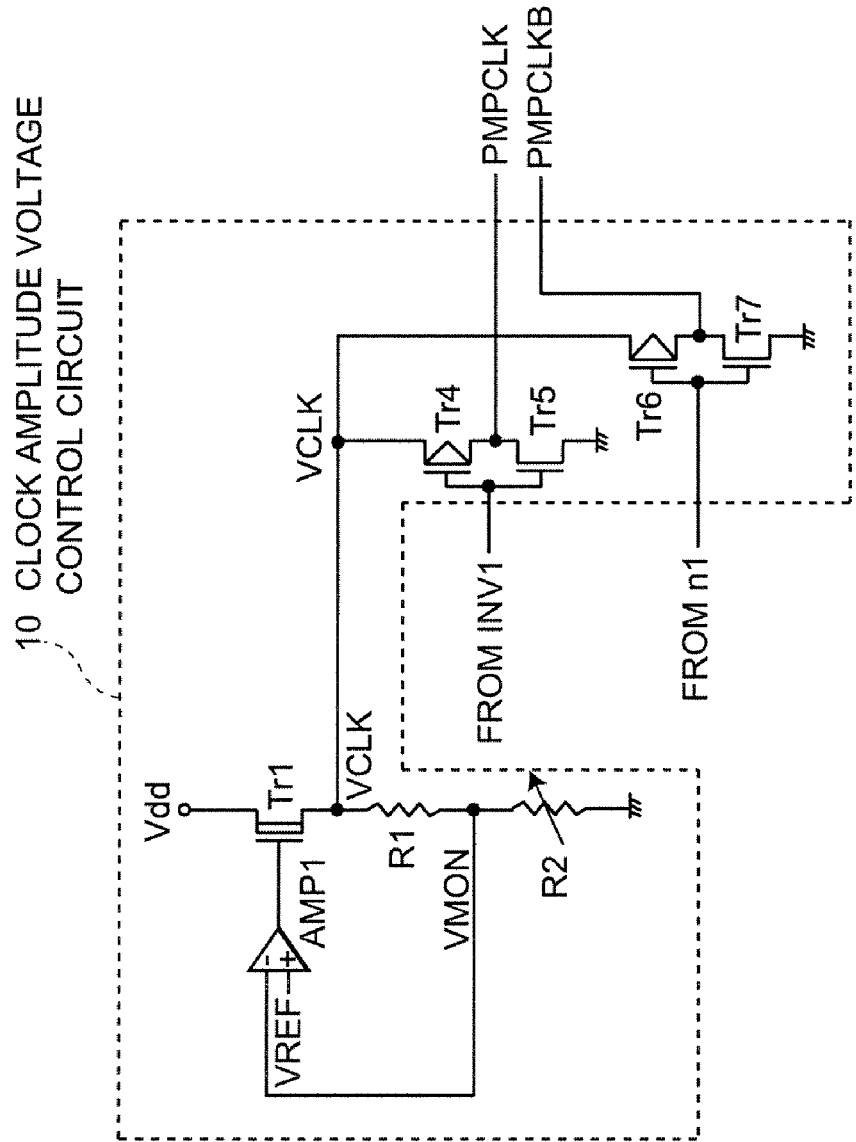
FIG. 19 is a diagram which shows a circuit construction of an amplitude voltage control circuit 10 related to one embodiment of this invention.

The clock amplitude voltage control circuit 10 related to one embodiment shown in FIG. 19 is constructed so that Tr1 is made a depression type N channel type transistor and VLCK is supplied directly to the source of Tr4 (or Tr5).

Figure 20:
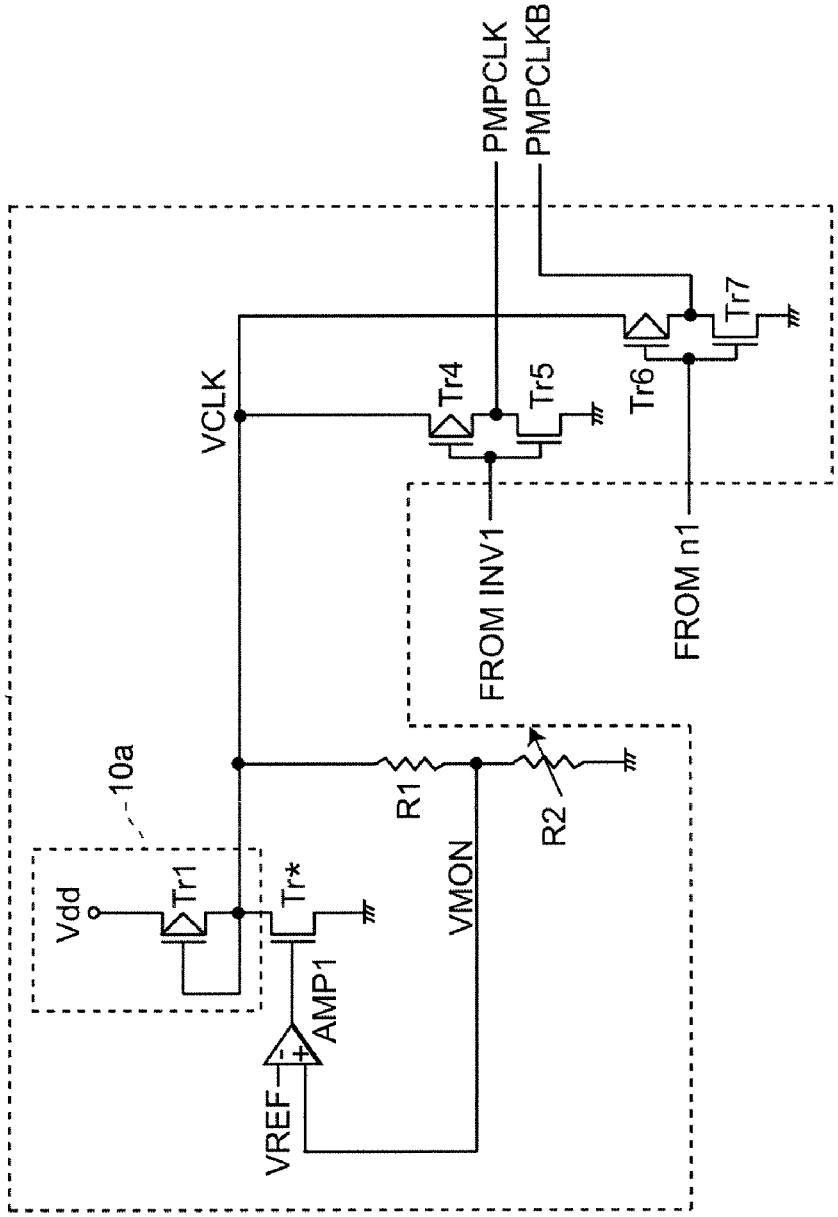
FIG. 20 is a diagram which shows a circuit construction of an amplitude voltage control circuit 10 related to one embodiment of this invention.
Figure 21A:
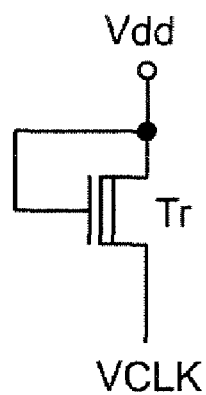
FIG. 21 is a diagram which shows;
(A) an example construction which uses a depression type N channel type transistor Tr1 as an active element 10a, and
(B) an example construction which uses a resistance element in the amplitude voltage control circuit 10 related to one embodiment of this invention.
Figure 21B:
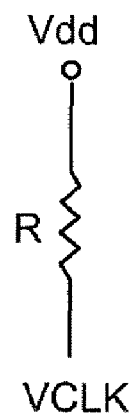

The clock amplitude voltage control circuit 10 related to one embodiment shown in FIG. 20 uses Tr1 as an active element 10a and Tr* is used as a passive element. The active element 10a which comprises Tr1 is constructed of a depression type N channel type transistor as shown in FIG. 21(A) and can also be constructed using a resistance element as shown in FIG. 21(B).

The clock amplitude voltage control circuit 10 in the pulse generation circuit 9 shown in FIGS. 17 to 21 can be used when the clock voltage amplitude VCLK satisfies VCLK<Vdd. Alternatively, in a clock amplitude voltage control circuit 10 in the pulse generation circuit 9 used in a nonvolatile semiconductor memory device related to one embodiment of this invention, the clock voltage amplitude VCLK can also satisfy VCLK>Vdd. Even in this case, by changing the clock amplitude voltage of the charge pump circuit it is possible to change that charge pumping capability.

Figure 22:
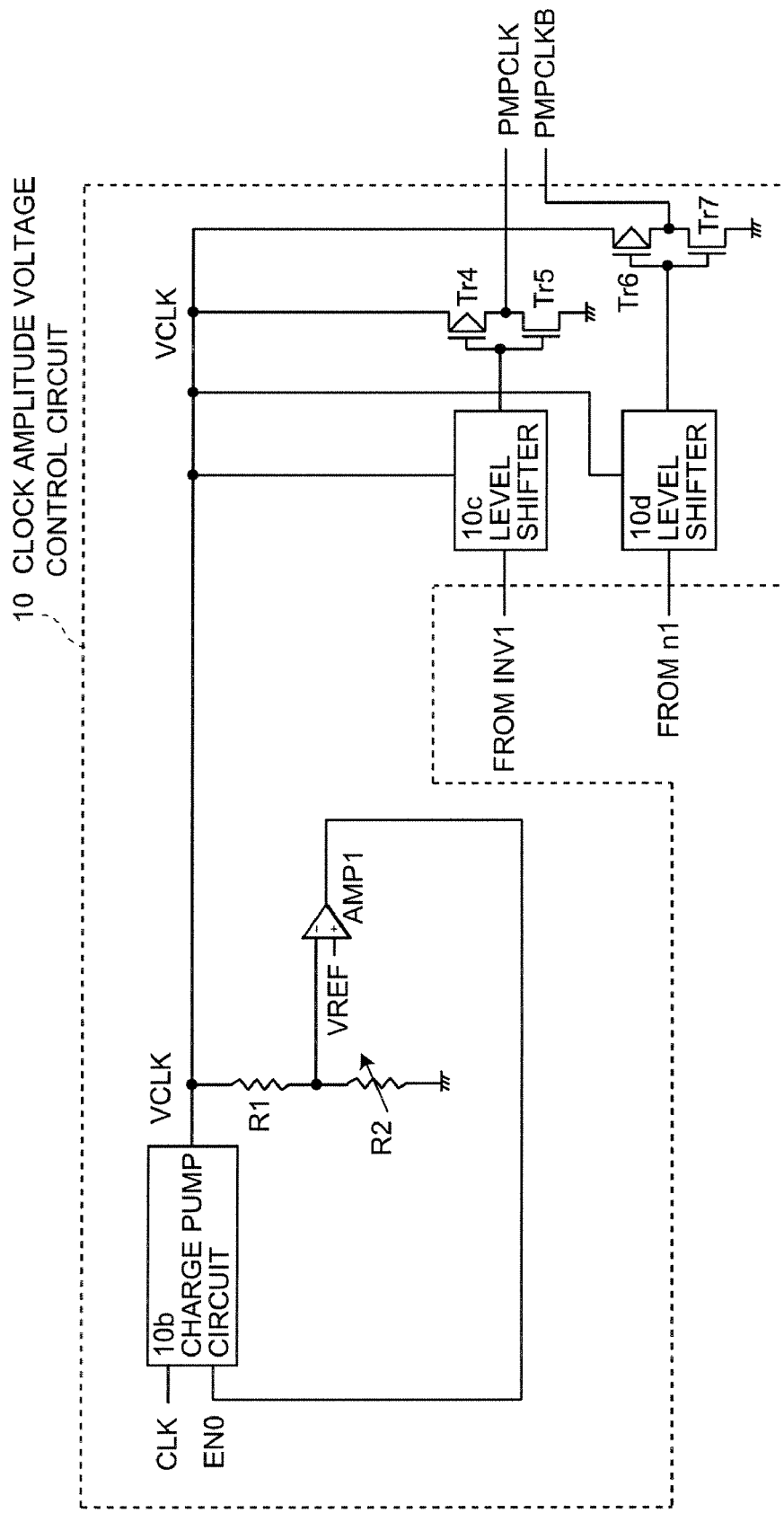
FIG. 22 is a diagram which shows a circuit construction of an amplitude voltage control circuit 10 related to one embodiment of this invention.

Also, in a clock amplitude voltage control circuit 10 related to one embodiment shown in FIG. 22, the clock amplitude voltage VCLK is increased higher than Vdd in advance by the charge pump circuit 10b (for example, several times higher than Vdd but <Vpp) and is used as the clock amplitude voltage of the charge pump circuit 11. Because the VCLK, which is obtained by the clock amplitude voltage control circuit 10 related to one embodiment shown in FIG. 22, is decided to be the voltage following the above stated formula (2) by changing the variable resistor R2 (or variable resistor R1, or (1+R1/R2) or VREF) it is possible to control the clock amplitude voltage VCLK.

Figure 23:
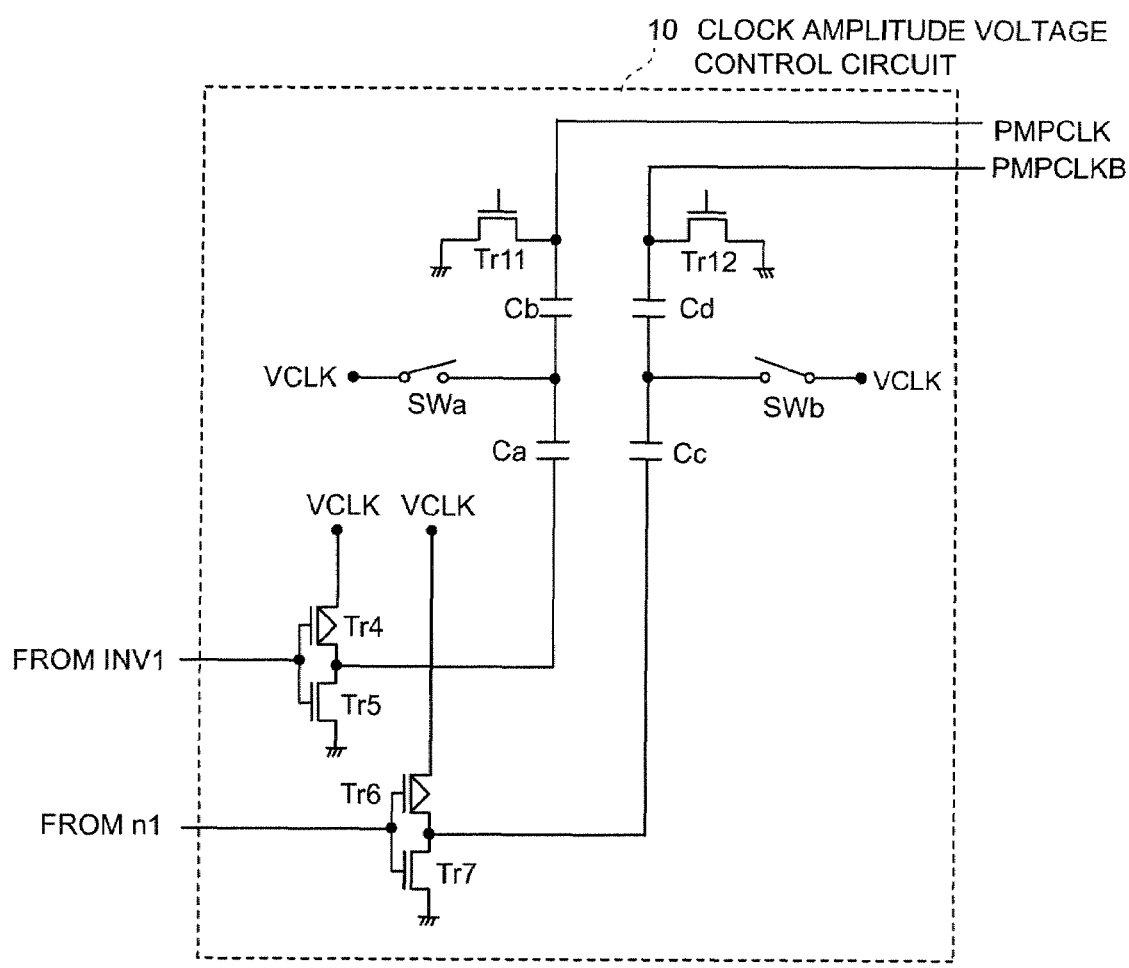
FIG. 23 is a diagram which shows a circuit construction of an amplitude voltage control circuit 10 related to one embodiment of this invention.

Also, the clock amplitude voltage control circuit 10 related to one embodiment shown in FIG. 23, in which the VCLK is obtained by the clock amplitude voltage control circuit 10 shown in FIGS. 17 to 21, is an example composed of capacitors connected in series of several steps (here using capacitors Ca, Cb, Cc and Cd and connected in a 2 step series) and by a boost effect the clock amplitude voltage is increased to a level higher then Vdd (for example, several times higher than Vdd but <Vpp)

Also, any circuit can function and can be used as a clock amplitude voltage control circuit 10 so long as it is a voltage control circuit composed of a VCLK controlled by the above stated formula (2) and a parameter which controls VCLK, namely a variable resistor R2 (or variable resistor R1, or (1+R1/R2) or VREF).

Figure 24C:
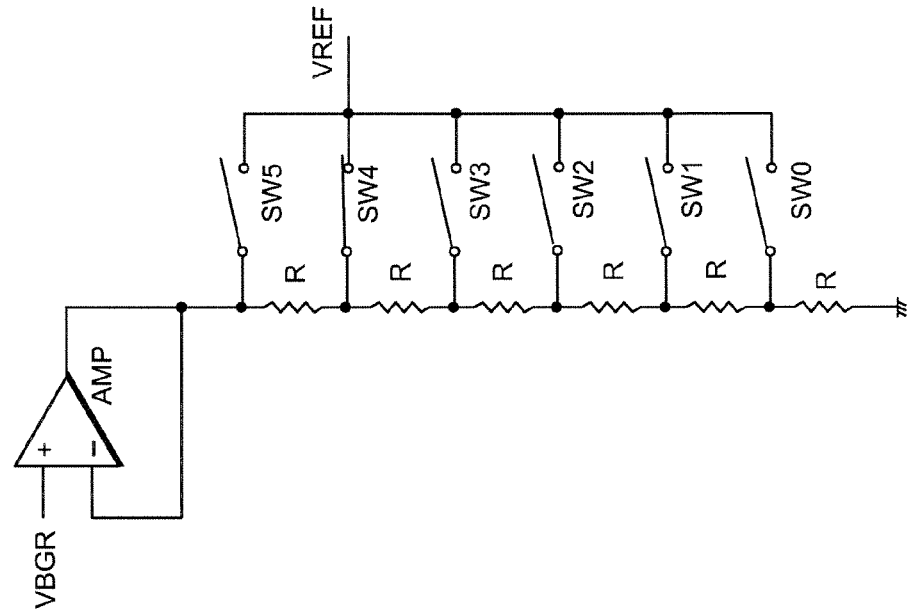
FIG. 24 is an example circuit realizing a variable resistor R2 (or variable resistor R1 or (1+R1/R2) or VREF) within a clock amplitude voltage control circuit 10.
Figure 24B:
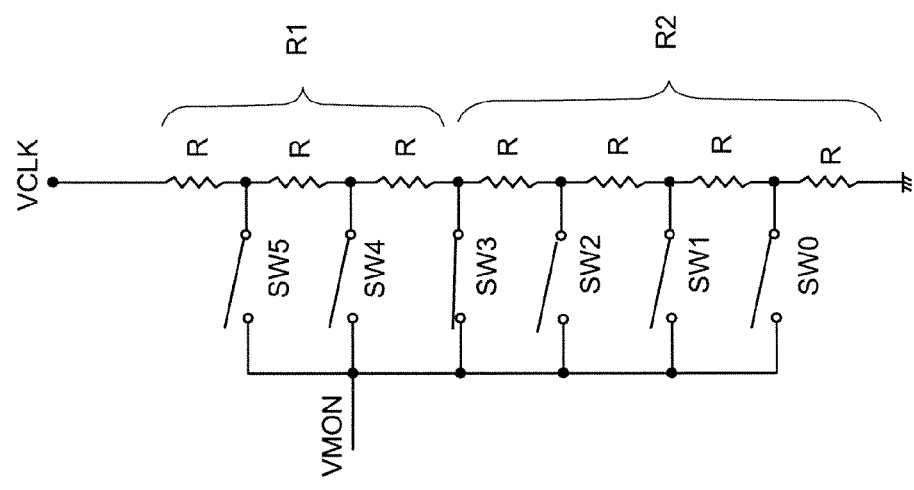
Figure 24A:
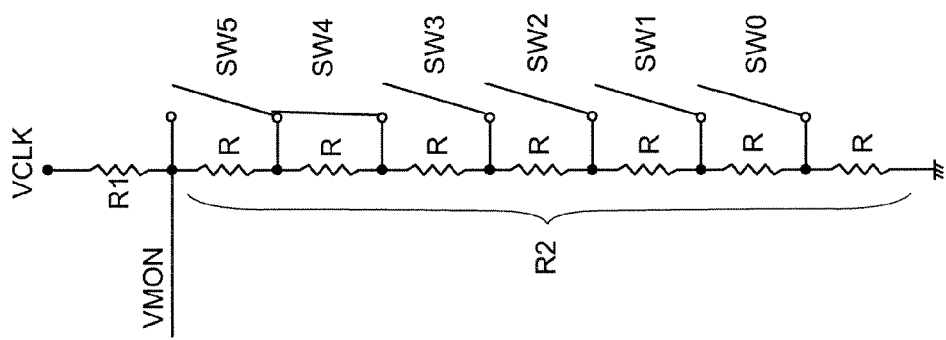
Figure 25:
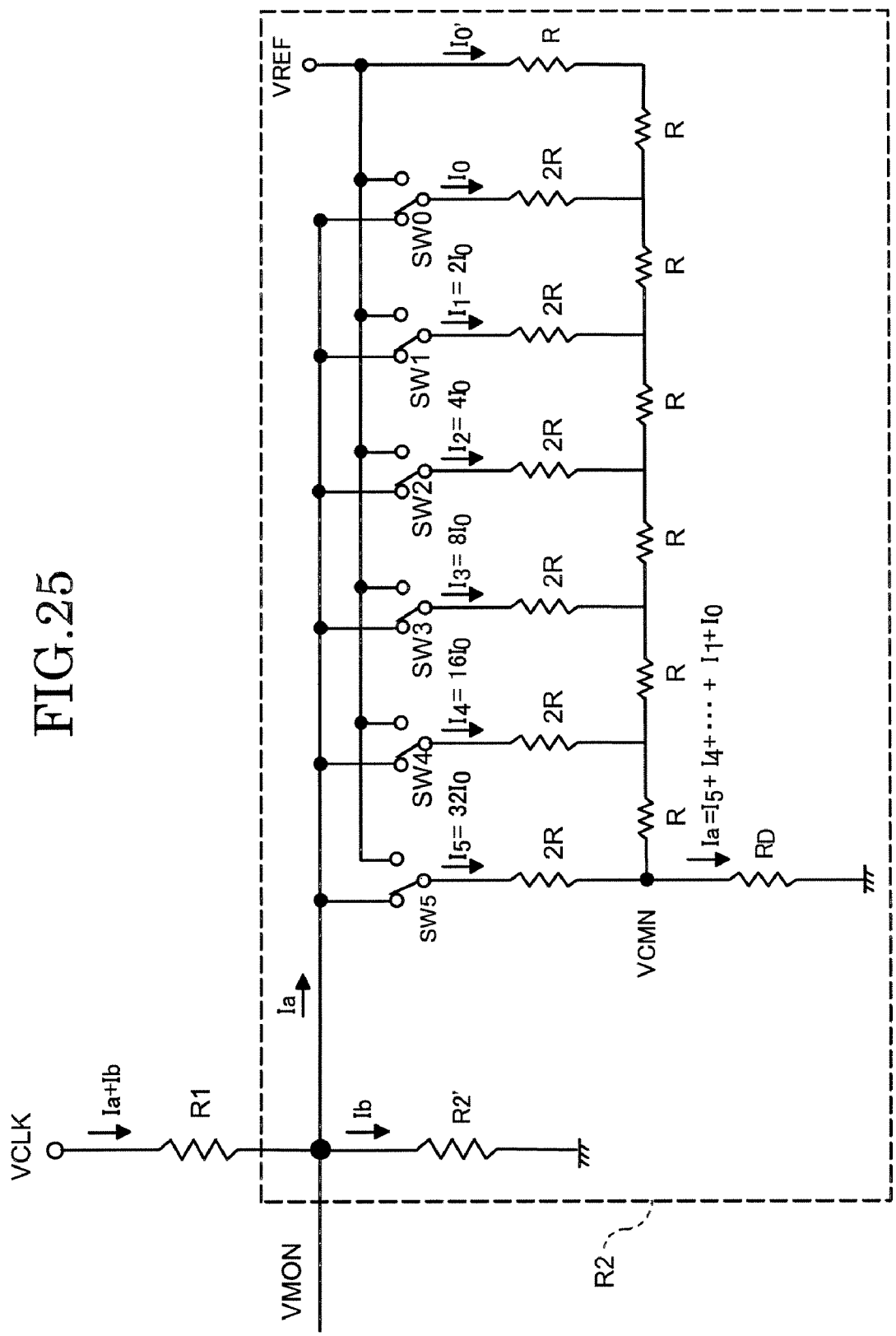
FIG. 25 is an example circuit realizing a variable resistor R2 (or a variable resistor R1 or (1+R1/R2) or VREF) within a clock amplitude voltage control circuit 10.

Here, an example circuit in order to realize the variable resistor R2 (or variable resistor R1, or (1+R1/R2) or VREF) inside the clock amplitude voltage control circuit 10, is shown in FIGS. 24 and 25. Further, the SWi in the drawing can be realized, for example, by a general N channel type transistor or P channel type transistor.

In FIG. 24(A) an example of a variable resistor R2 inside the clock amplitude voltage control circuit 10 in which a plurality of resistors R are connected in series and in which the whole resistance value R2 is controlled by the switch SWi (here SWi is any or a combination of SW1, SW2, SW3, SW4 or SW5) is shown. Also, the resistor R1 may be constructed by using a plurality of resistors and a plurality of switches. Further, while in FIG. 24(A), seven resistors R are connected in series and the whole resistance value R2 is controlled by the switches SW1, SW2, SW3, SW4, and SW5, the numbers of the resistances R and of the switches SWi are not limited to this example.

In FIG. 24(B) an example of a variable resistance circuit R1 and R2 inside the clock amplitude voltage control circuit 10 in which a plurality of resistors R are connected in series and in which the whole resistor value [1+R1/R2] is controlled by the switch SWi (here SWi is any or a combination of SW1, SW2, SW3, SW4 or SW5). Further, while in FIG. 24(B) seven resistors R are connected in series, and the whole resistance value [1+R1/R2] is controlled by the switches SW1, SW2, SW3, SW4 and SW5, the numbers of resistors R and switches SWi is not limited to this example.

FIG. 24(C) is an example which is composed so that VREF is variably controlled. A plurality of resistors R are connected in series and the whole resistance value which is a sum value of the resistors connected in series and which is controlled by switches SWi (here SWi is any or a combination of SW1, SW2, SW3, SW4 or SW5). Also, the output of an AMP, which inputs the output from Bandgap Regulator VBGR and the feedback signal of the output of said AMP, is input into the resistor which comprises a plurality of resistors R connected in series. Further, while in FIG. 24(C) six resistors R are connected in series and VREF is controlled by switches SW1, SW2, SW3, SW4 and SW5, the numbers of resistors and of switches SWi are not limited to this. Further, the plurality of resistors R used here can each use the same resistance value or they can use a different resistance value.

FIG. 25 shows an example of a variable resistor R2 which comprises a plurality of resistors and a plurality of switches. Further, because the variable resistor R2 shown in FIG. 25 has a similar construction to the resistance dividing circuit 12a shown in FIG. 8 it is not explained again here.

Also, aside from above, even in the case where any circuit is used, as long as it is a circuit which realizes a variable resistor R2 (or variable resistor R1, or (1+R1/R2) or VREF) it functions as a clock amplitude voltage control circuit 10 of the pulse generation circuit 9 which is used in a nonvolatile semiconductor memory device related to one embodiment of the present invention.

Figure 26:
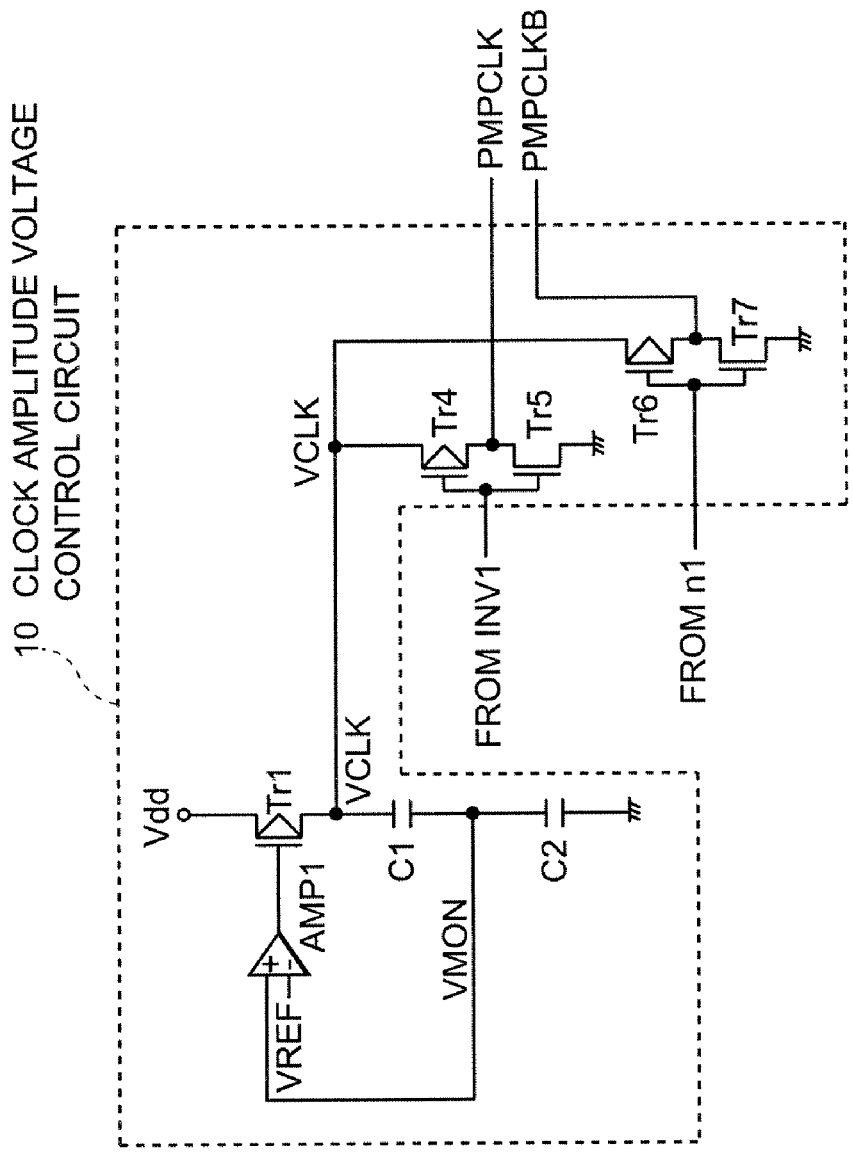
FIG. 26 is a diagram showing a circuit construction of an amplitude voltage control circuit 10 related to one embodiment of this invention.

Further, an example of a clock amplitude voltage control circuit 10 in which variable resistors R1, R2 are replaced by capacitors C1 and C2 is shown in FIG. 26. In this case, it is possible to obtain a clock amplitude voltage VCLK of the prescribed amplitude decided by the formula (10) below.

$$VCLK=(1+C2/C1)\times VREF \qquad (11)$$

As explained above, in the present embodiment, by changing the variable resistor R2 (or variable resistor R1, or (1+R1/R2) or VREF) according to the required target output voltage, it is possible to make the arrival time independent from the target output level.

EMBODIMENT 4

In the present embodiment, a nonvolatile semiconductor memory device related to the above stated embodiments is explained in a case where the time applying a program pulse is shortened in one series of program pulses, that is to say, in a case of enlarging the differential (dVcg/dt, dVpp/dt) of the voltage Vcg (Vpp) which is applied to the control gate, in other words, in a case of enlarging the value of the program pulse step-up width ΔVpp/application time Δt.

Figure 27:
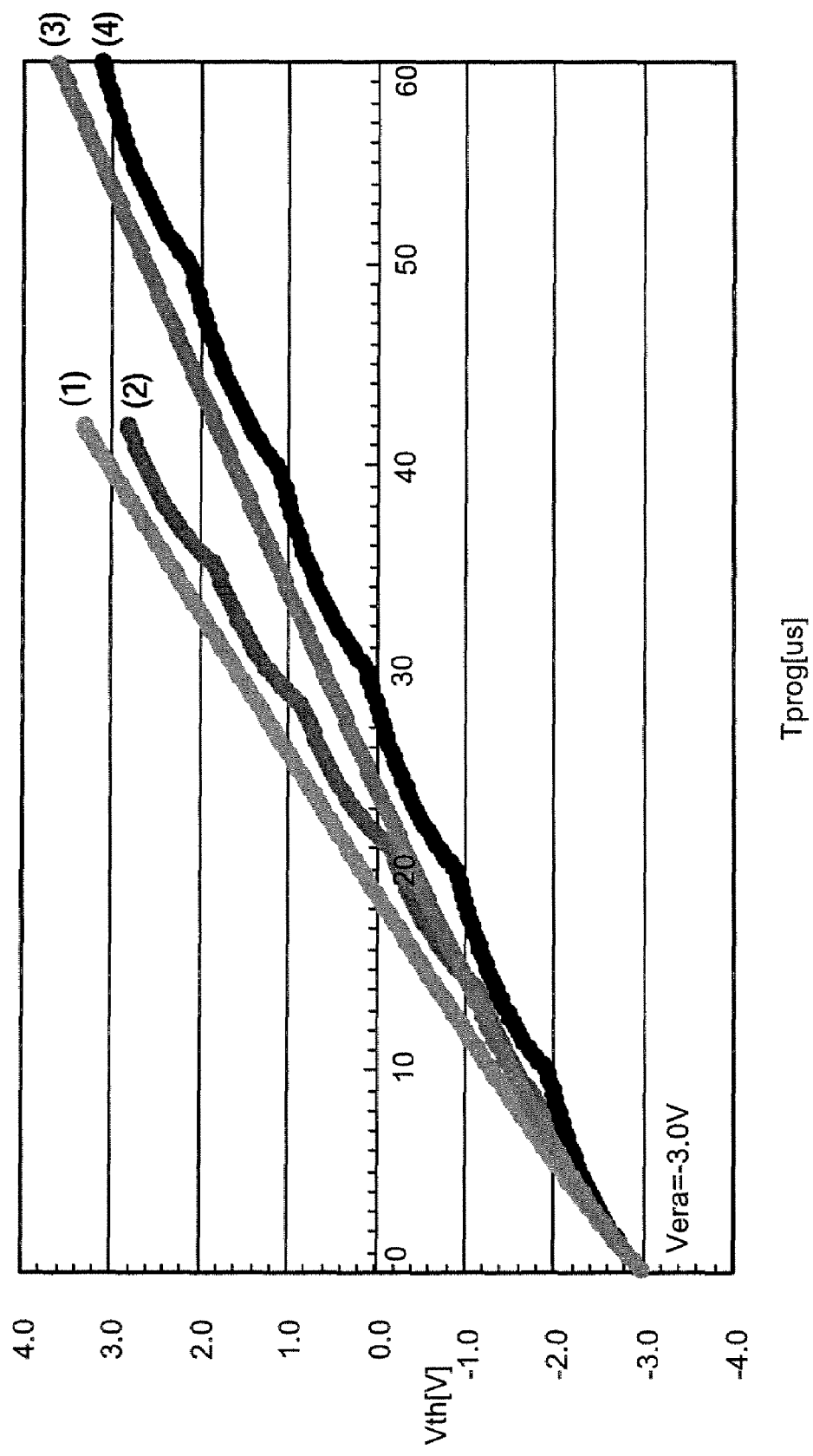
FIG. 27 is a computer simulation result obtained by using an equivalent circuit of a memory cell shown in FIG. 1(b) of a nonvolatile semiconductor memory device related to one embodiment of this invention.
Figure 28:
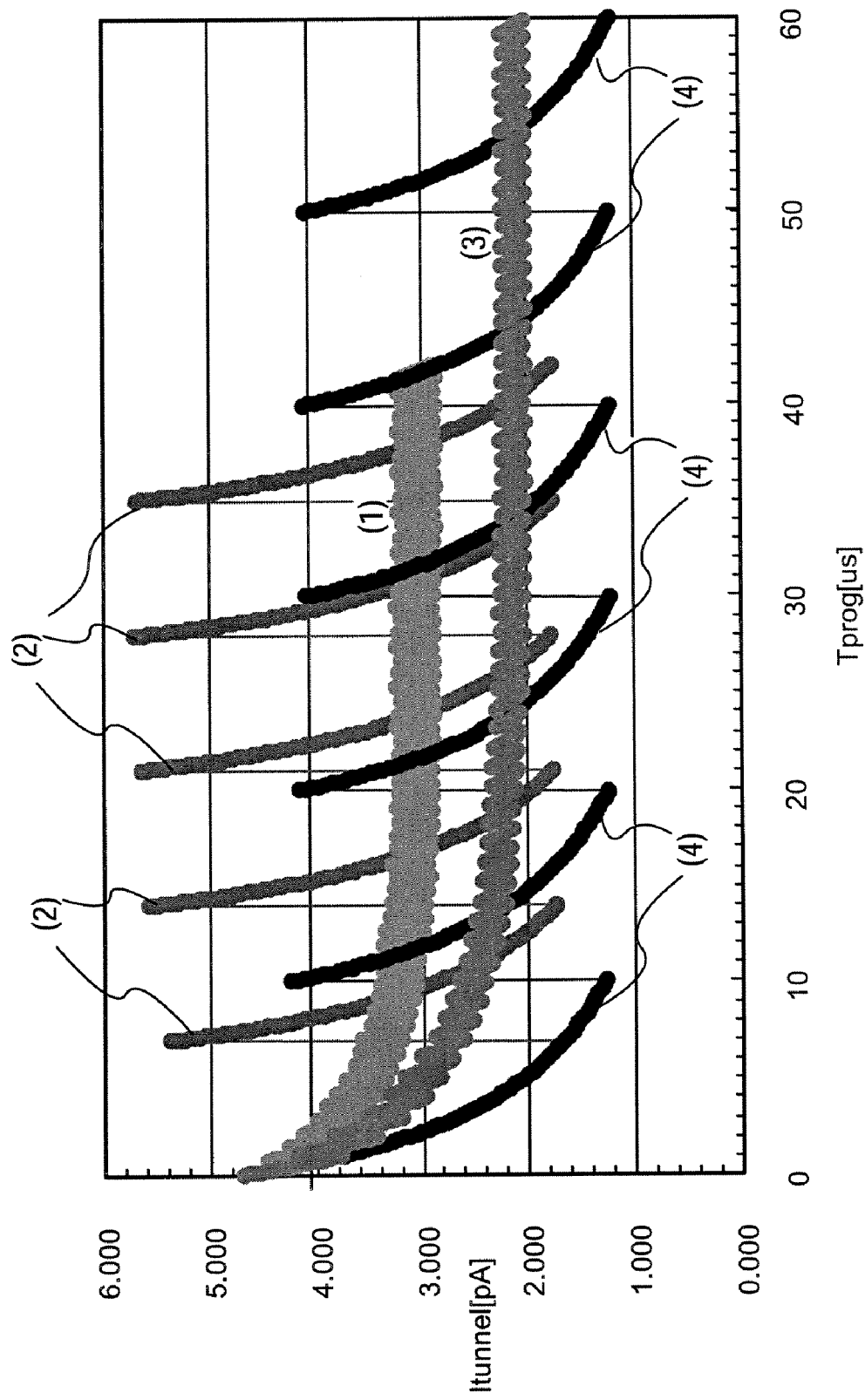
FIG. 28 is a computer simulation result obtained by using an equivalent circuit of a memory cell shown in FIG. 1(b) of a nonvolatile semiconductor memory device related to one embodiment of this invention.

FIGS. 27 and 28 is referred to. FIGS. 27 and 28 show computer simulation results in which an equivalent memory cell circuit shown in FIG. 1(b) of a nonvolatile semiconductor memory device related to one embodiment of the present invention is used. In FIG. 27, the vertical axis corresponds to a memory cell threshold value and the horizontal axis corresponds to a program time (Tprog). In FIG. 28, the vertical axis corresponds to a tunnel current (Itunnel) which flows through a memory cell and the horizontal axis corresponds to a program time (Tprog). In FIGS. 27 and 28 the simulation results under the following four parameter conditions ((1), (2), (3), (4)) are shown. Further, in whichever of three of these parameter conditions, the memory cell threshold initial value is set to −3.0V, Vpp0=17V, ΔVpp1V, and series of program pulses are repeated from n=0 to n=5. Consequently, the first program voltage Vcg applied in each series of program pulses becomes 17V(n=0), 18V(n=1), 19V(n=2), 20V(n=3), 21V(n=4), and 22V(n=5). The four parameter conditions of the series of program pulses ((1), (2), (3), (4)) are as follows.

(1) a condition under which one series of the program pulses comprises 10 pulses, each pulse being 0.7 μs width and raising the voltage in increments of ΔVpp=0.1V every 0.7 μs (2) a condition under which one series of the program pulses is a series of pulses each 7 μs width (conventional method)

(3) a condition under which one series of the program pulses comprises 10 pulses, each pulse being 0.1 μs width and raising the voltage in increments of ΔVpp=0.1V every 0.1 μs (4) a condition under which one series of the program pulses is a series of pulses each 10 μs width (conventional method)

The calculation formula and parameters used in the computer simulation shown in FIG. 4 are as follows.

$\Delta Vth = Itunnel \times Tprog/Cono$ $Itunnel = s \times \alpha \times E^2 \times \exp(-\beta/E)$ $S(\text{memory cell Cox area}) = 0.005041 [\mu m^2]$ $E(\text{electrical field strength}) = Vfg/Tox$ $\alpha = 6.94 \times 10^{-7} [A/V^2]$ $\beta = 2.54 \times 10^8 [V/cm]$ $Tox = 8.2 [nm]$ $Cono = Cox = 0.0212 [fF]$ (shown above is the same as the conditions in embodiment 1)

From the simulation result in FIG. 27, if ΔVpp is the same and if the time for applying one program pulse in one series of program pulses is shortened, that is to say, if the value of the program pulse step-up width ΔVpp/the application time Δt is enlarged, in other words, if the differential of Vpp (dVpp/dt) is enlarged, then the amount of change of the memory cell threshold value becomes larger and it is possible to shorten the program time. Consequently, it can be said that conditions (1) and (2) can shorten the program time more than conditions (3) and (4).

Also, from the simulation result in FIG. 28, if ΔVpp is the same, then in the case where a certain fixed program pulse is continuously applied in one series of program pulses as in conditions (2) and (4), in the succeeding series of program pulses a precipitous tunnel current Itunnel flows. Consequently, applying a program pulse which raises by the voltage of each certain step-up width in the series of program pulses as in conditions (1) and (3) the flow of a precipitous tunnel current Itunnel can be better prevented and it is considered that reliability can be improved. On the other hand, from the viewpoint of the program time, the condition (2) shortens the program time more than the condition (1).

Therefore, for shortening the program time and improving reliability, the condition (1) is understood to be preferred.

Figure 29:
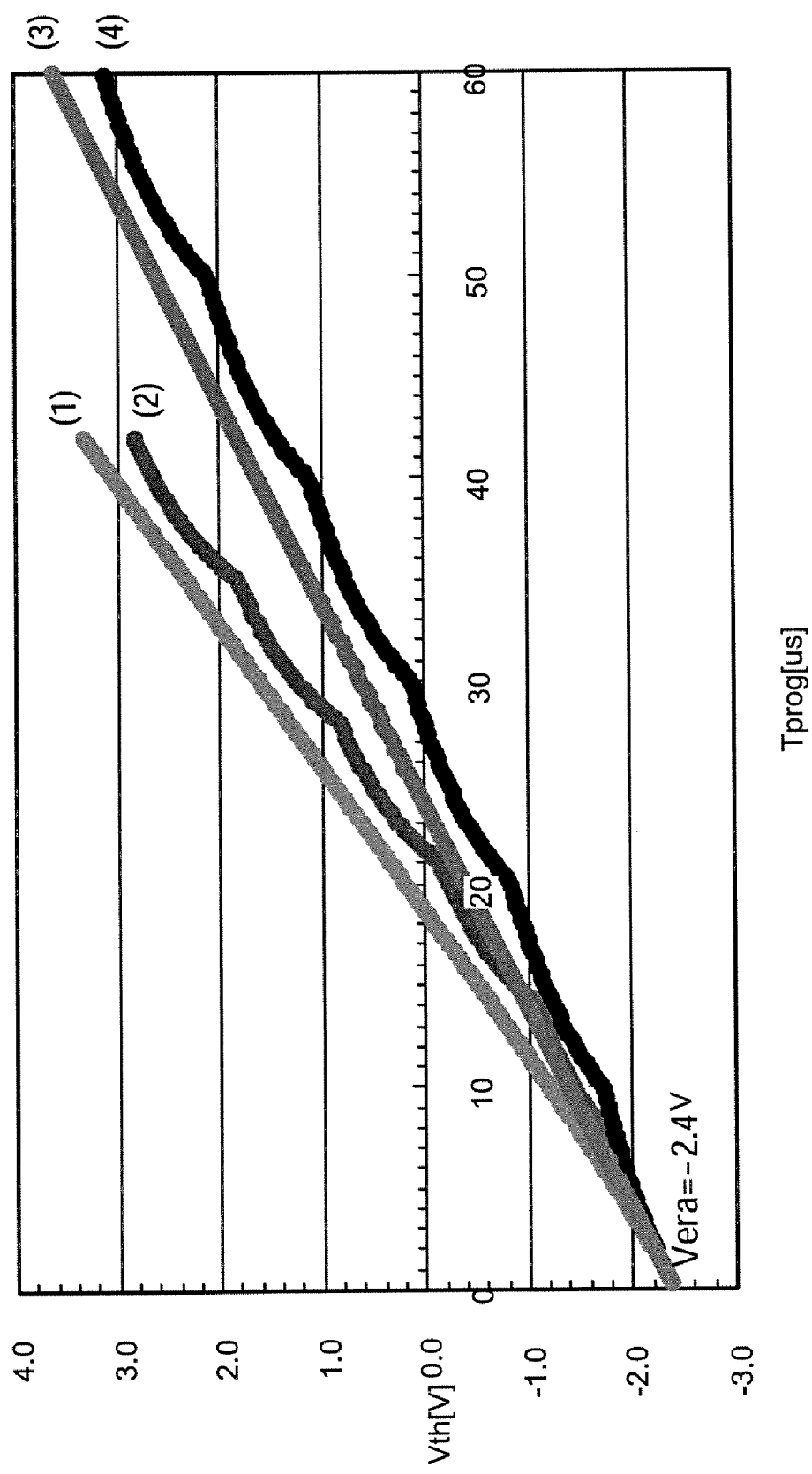
FIG. 29 is a computer simulation result obtained by using an equivalent circuit of a memory cell shown in FIG. 1(b) of a nonvolatile semiconductor memory device related to one embodiment of this invention.
Figure 30:
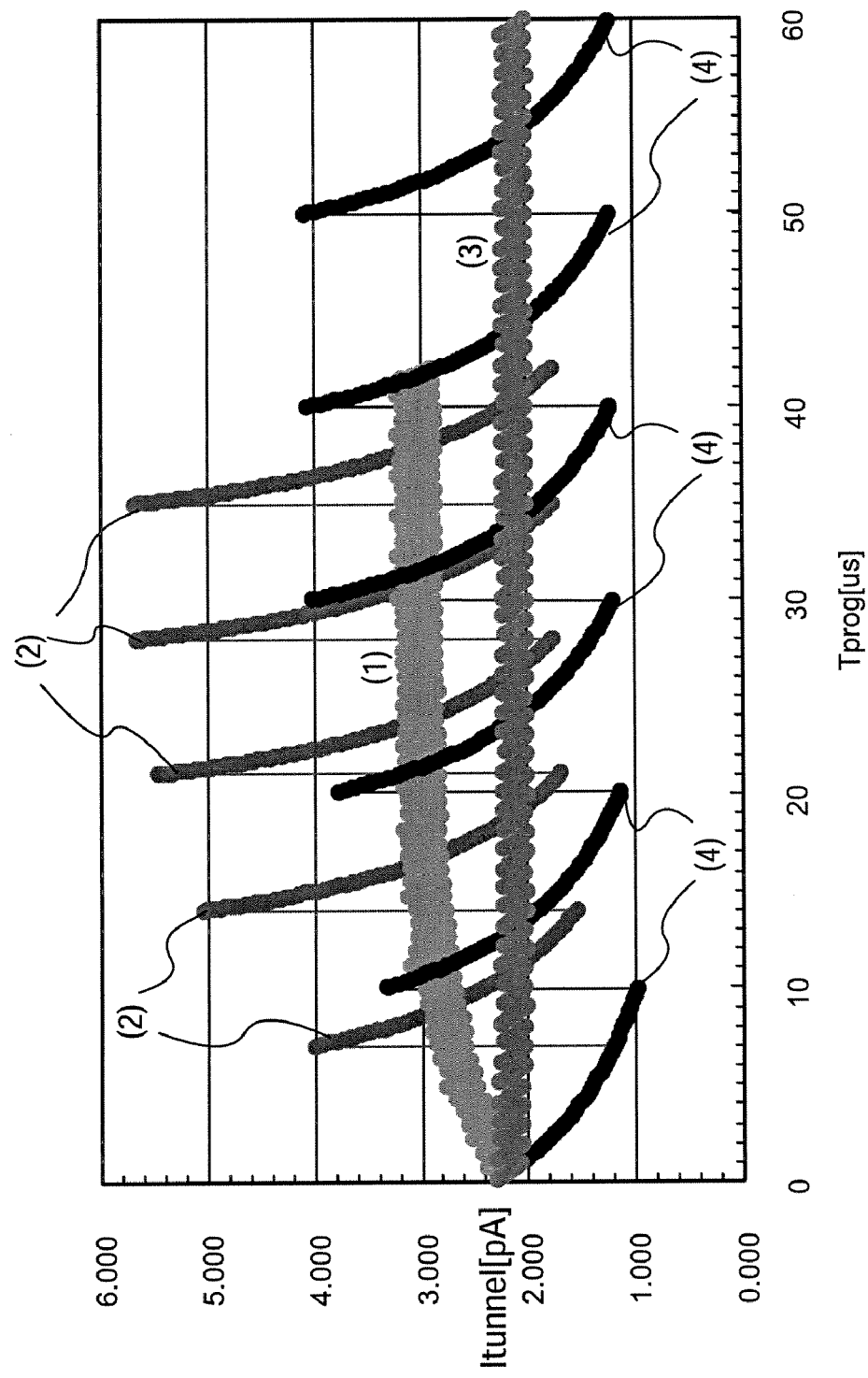
FIG. 30 is a computer simulation result obtained by using an equivalent circuit of a memory cell shown in FIG. 1(b) of a nonvolatile semiconductor memory device related to one embodiment of this invention.

FIGS. 29 and 30 show the similar simulation results to FIGS. 27 and 28 where the memory cell threshold initial value is used as −2.4V. It is also understood from FIGS. 29 and 30 that a similar tendency appears as that in FIGS. 27 and 28.

Consequently, according to a nonvolatile semiconductor memory device of this invention related to this embodiment, by enlarging the Vpp differential (dVpp/dt) the effect that data program time is shortened can be obtained. Also, applying a program pulse which raises by the voltage of each certain step-up width in the series of program pulses can better prevent the flow of a precipitous tunnel current Itunnel and reliability can be improved.

EMBODIMENT 5

In the present embodiment a nonvolatile semiconductor memory device related to the above stated embodiments is explained in a case where the realization of the multi value (8 values, 16 values, 32 values etc) technology which records multi bit data in a memory cell.

Figure 31:
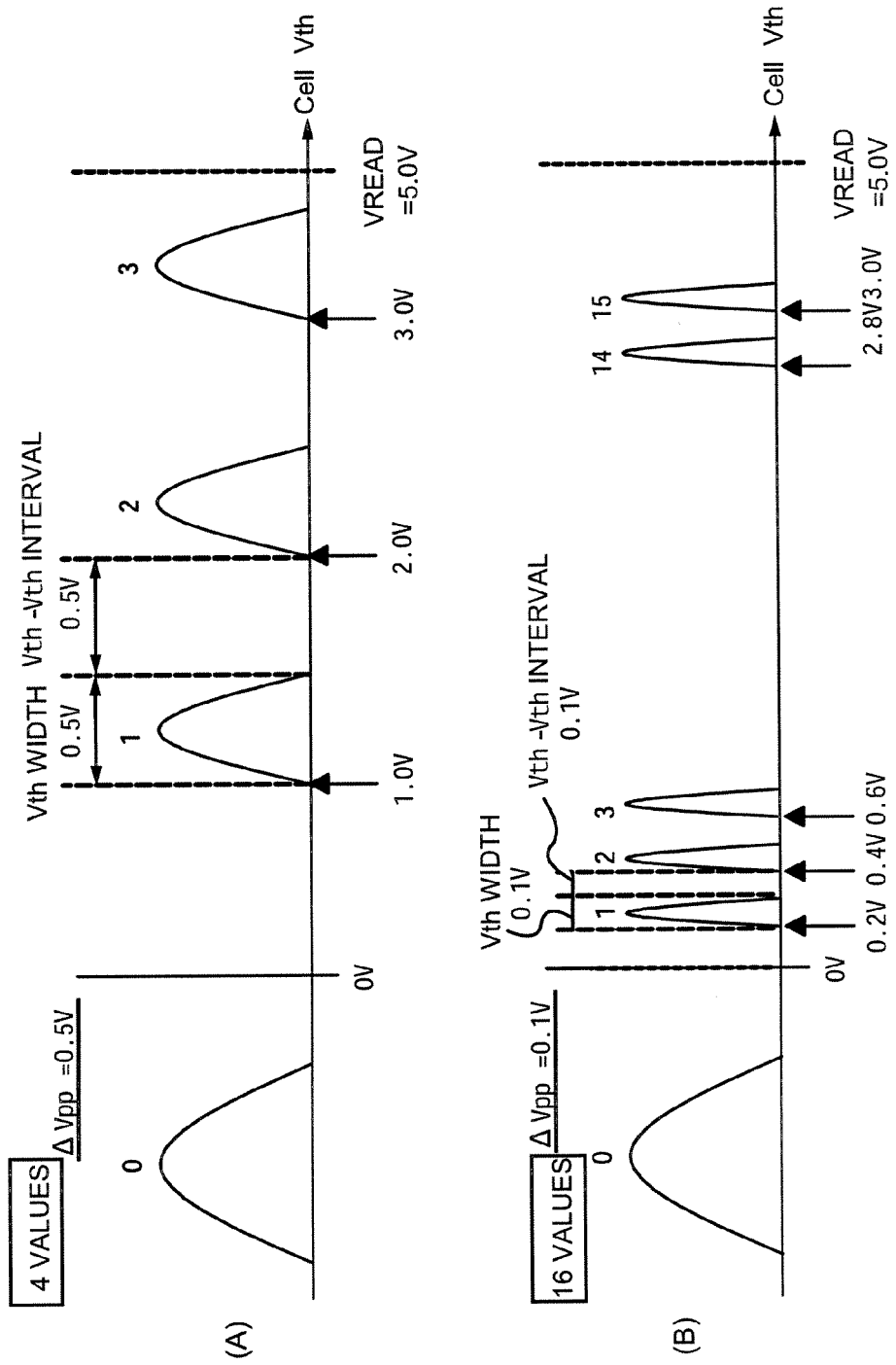
FIG. 31 is a pattern diagram which represents a threshold value distribution of;
(A) the case where the 4 values are recorded in a memory cell, and
(B) the case where the 16 value are recorded in a memory cell, in a nonvolatile semiconductor memory device related to one embodiment of this invention.

In FIG. 31, as one example of a nonvolatile semiconductor memory device of this invention related to the above stated embodiments, a pattern diagram which expresses the threshold value distribution in the case (drawing 31(A)) where data of 4 values is recorded and the threshold value distribution in the case (drawing 31(B)) where data of 16 values is recorded in a memory cell, is shown. As the number of multi values increases from 4 values to 16 values there is a need to further narrow the threshold value width (Vth width) of a memory cell around a peak of a threshold value distribution of a certain memory cell. In the example shown in FIG. 31, the width Vth in the case of the value 4 is 0.5V, and the width Vth in the case of the value 16 is 0.1V.

Also, as the number of multi values increases from 4 values to 16 values, there is a need to further narrow the interval (Vth-Vth interval) between the threshold value distribution of a certain memory cell and the threshold value distribution of a memory cell which adjoins it. In the example shown in FIG. 31, the Vth–Vth interval in the case of the value 4 is 0.5V, and the Vth–Vth interval in the case of the value 16 is 0.1V.

On the other hand, the relationship between the step-up voltage ΔVpp and ΔVth and the relationship between the step-up voltage ΔVpp and the threshold value change (ΔVth) of a memory cell by the application of one program pulse are the relationships shown by the formulas (12) and (13) below.

$$\Delta Vth = \Delta Vpp \quad (12)$$

$$\text{width of } Vth = \Delta Vpp - \quad (13)$$

From the relationship shown by formula (12) and (13) stated above, in the case where a further plurality of multi values are to be realized, there is a need to lower further the step-up voltage. On the other hand, as stated above, because an exponential function relationship is established between the threshold value change (ΔVth) of a memory cell by a data program and the voltage used for the data program, when the voltage used for a data program becomes higher than the set value by overshooting for example, there occurs a case in which a data program operation progresses further than an operation with requested program target and an incorrect data program (over-program) may occur.

Similarly, while the threshold value change (ΔVth) of a memory cell by a data program operation is proportional to the program time, the time to reach the data program voltage becomes different between a case when the data program voltage is high and a case when it is low. In other words, the lower the data program voltage the shorter is the time to reach the data program voltage. Accordingly, when the data program voltage is low, a data program operation progresses further than an operation with requested program target and an incorrect data program (over-program) may occur. Alternatively, because the time for data program operation becomes longer when the program target voltage is high, the time to reach the data program target voltage becomes late, In other words, as stated above, in the case where a further plurality of multi values are realized, the threshold value interval (Vth interval) of memory cells around a peak of a threshold value distribution of a certain memory cell becomes narrower and the interval (Vth-Vth interval) between the threshold value distribution of a certain memory cell and the threshold value distribution of a memory cell which adjoins it becomes narrower. Because of this, due to an overshooting of a program pulse or variations in the time to reach the data program target voltage, the possibility of variations in data program characteristic of memory cells, occurrences of over-program, or an increase in program time becomes higher.

Because of the above stated problems, when further plurality of multi values are realized, the following type of control of program pulses becomes necessary and important. That is, there is a need to output the data program target voltage (Vpp) and step-up pulse ($\Delta$Vpp) while suppressing as much as possible program pulse overshoot or ripple. Also, there is a need to eliminate variations in the time for data program while fixing as much as possible the time to reach the program voltage without depending on whether the program voltage is high or low.

Accordingly, a program voltage control method of the nonvolatile semiconductor memory device according to one embodiment of this invention, that is, by using the various pulse generation circuits 9 stated above, it is possible to suppress overshooting voltage without depending on program voltage and also by being able to almost fix the time to reach the target output voltage, and it is an effective method for realizing further multi values.

Further, here, a description has been made that in order to realize multi values, using a nonvolatile semiconductor memory device according to one embodiment of this invention is an effective means for programming data to a memory cell, but it is also effective for not only data program operation but also for erasure and read-out operations.

EMBODIMENT 6

While in the above stated embodiments, in the embodiments 1 through 5, a nonvolatile semiconductor memory device of the present invention has been taken as an example to explain a NAND cell type nonvolatile semiconductor memory device, a nonvolatile semiconductor memory device of the present invention can also be a NOR cell type, DINOR cell type, AND cell type EEPROM nonvolatile semiconductor memory device Also, according to one embodiment of the present invention, a nonvolatile semiconductor memory device comprising an electronically reprogrammable memory cell constructed with a floating gate and a control gate laminated on a semiconductor layer, means for applying a plurality of threshold value variation pulses which have a high potential at a predetermined value in steps and each at fixed time intervals to said memory cell; and verify means for detecting said memory cell threshold value after applying said plurality of threshold value variation pulses is provided.

Also, according to one embodiment of this invention, an operation method of a nonvolatile semiconductor memory device having an electronically reprogrammable memory cell constructed with a floating gate and a control gate stacked on a semiconductor layer, said operation method comprising a step of applying higher potentials step by step to said memory cell, said higher potential being obtained by adding a prescribed value to the last potential applied to said memory cell, in the case when a threshold value of said memory cell is detected after applying a plurality of threshold value variation pulses in steps and in the case detected threshold does not reach a prescribed value, is provided.

Also, according to one embodiment of this invention, an operation method of a nonvolatile semiconductor memory device having an electronically reprogrammable memory cell constructed with a floating gate and a control gate stacked on a semiconductor layer, said operation method comprising a step of applying higher potentials step by step to said memory cell for a predetermined time period, said higher potential being obtained by adding a predetermined value to the last potential applied to said memory cell, in the case when a threshold value of said memory cell is detected after applying in steps a plurality of threshold value variation pulses for a predetermined time period and in the case detected threshold does not reach a predetermined value, is provided.

Also, according to one embodiment of this invention, an operation method of a nonvolatile semiconductor memory device having an electronically reprogrammable memory cell constructed with a floating gate and a control gate stacked on a semiconductor layer, said operation method being characterized in that the time necessary for a plurality of threshold value variation pulses which have high potentials changing step by step with a predetermined value to reach a plurality of target potentials is maintained approximately fixed without depending on the value of said high potentials, is provided.

According to a nonvolatile semiconductor memory device and an operation method related to one embodiment of this invention, it is possible to realize a reduction in the data program time. Also, according to a nonvolatile semiconductor memory device and its operations methods of this invention, by increasing the potential of the program pulse little by little by increments of the step-up width $\Delta$Vpp in one series of the program pulses it is possible to prevent a precipitous electrical field being applied to a memory cell (a precipitous tunnel current flows) in the succeeding series of program pulses after a verify operation and it is possible to control the degradation of a tunnel oxide film or a break in insulation etc, and improve the reliability of the nonvolatile semiconductor memory device.

Consequently, according to a nonvolatile semiconductor memory device and an operation method of one embodiment of this invention, it is possible to realize a nonvolatile semiconductor memory device with high speed and high reliability. A nonvolatile semiconductor memory device of the present invention can be used as a memory device for electronic equipment such as a computer, digital camera, mobile telephone, household electrical appliance, etc

What is claimed is:

1. A nonvolatile semiconductor memory device comprising:
   a plurality of electronically reprogrammable memory cells;
   a circuit for applying a plurality of pulse signals having corresponding high level potentials increasing step by step to said memory cell; said circuit for applying said plurality of pulse signals comprising:
   a first circuit for generating a first clock having a first amplitude voltage and a second clock having a second amplitude voltage which is higher than said first amplitude voltage;
   a second circuit for generating said plurality of said pulse signals having corresponding voltages based on said first clock or said second clock input from said first circuit respectively; and
   a third circuit for stopping an input of said first clock and said second clock to said second circuit when said plurality of pulse signals generated by said second circuit reach said corresponding voltages respectively; and a verify circuit for detecting a threshold value of said memory cell after applying said plurality of pulse signals.

2. The nonvolatile semiconductor memory device according to claim 1, wherein said second circuit generates a pulse signal having a higher voltage when said second clock is input than when said first clock is input.

3. The nonvolatile semiconductor memory device according to claim 2, wherein said second clock is input to said second circuit if said verify circuit detects an insufficient threshold value after applying said plurality of pulse signals generated by said second circuit based on said first clock.

4. The nonvolatile semiconductor memory device according to claim 2, wherein an overshoot voltage generated by said second circuit based on said first clock approximately is the same as an overshoot voltage generated by said second circuit based on said second clock.

5. The nonvolatile semiconductor memory device according to claim 2, wherein delay times for said third circuit to stop said inputs of said first clock and said second clock to said second circuit when said plurality of pulse signals generated by said second circuit reach said corresponding voltages respectively are approximately constant.

6. The nonvolatile semiconductor memory device according to claim 1, wherein the voltage of each of said plurality of pulse signals generated by said second circuit based on said first clock or said second clock increases gradually.

7. The nonvolatile semiconductor memory device according to claim 1, wherein said pulse signal shifts a threshold value of said memory cell.

8. The nonvolatile semiconductor memory device according to claim 1, wherein said circuit for applying said plurality of pulse signals having high level potentials increasing step by step generates said plurality of pulse signals having high level potentials increasing step by step by making an enable signal of a charge pump circuit on and off.

9. The nonvolatile semiconductor memory device according to claim 1, wherein said memory cell comprises a charge storage layer and a control gate stacked on a semiconductor layer.

10. The nonvolatile semiconductor memory device according to claim 9, wherein said charge storage layer is a floating gate.

11. The nonvolatile semiconductor memory device according to claim 8, wherein said plurality of memory cells are connected in series.

* * * * *